United States Patent
Cui et al.

(10) Patent No.: US 12,013,427 B2
(45) Date of Patent: Jun. 18, 2024

(54) HIGH IMPEDANCE FAULT DETECTION AND LOCATION ACCURACY

(71) Applicants: Qiushi Cui, Tempe, AZ (US); Yang Weng, Chandler, AZ (US)

(72) Inventors: Qiushi Cui, Tempe, AZ (US); Yang Weng, Chandler, AZ (US)

(73) Assignee: Arizona Board of Regents on behalf of Arizona State University, Scottsdale, AZ (US)

( * ) Notice: Subject to any disclaimer, the term of this patent is extended or adjusted under 35 U.S.C. 154(b) by 0 days.

(21) Appl. No.: 17/337,976

(22) Filed: Jun. 3, 2021

(65) Prior Publication Data

US 2021/0396799 A1    Dec. 23, 2021

Related U.S. Application Data

(60) Provisional application No. 63/039,215, filed on Jun. 15, 2020.

(51) Int. Cl.
   *G01R 27/16*    (2006.01)
   *G01R 23/16*    (2006.01)
   *G01R 31/08*    (2020.01)

(52) U.S. Cl.
   CPC ........... *G01R 31/088* (2013.01); *G01R 23/16* (2013.01); *G01R 27/16* (2013.01); *G01R 31/086* (2013.01)

(58) Field of Classification Search
   CPC ...... G01R 31/088; G01R 23/16; G01R 27/16; G01R 27/02; G01R 31/086; Y02E 40/70; Y02E 60/00; Y04S 10/22
   See application file for complete search history.

(56) References Cited

U.S. PATENT DOCUMENTS

| 4,466,071 A | * | 8/1984 | Russell, Jr. | .............. H02H 3/52 324/520 |
| 5,578,931 A | | 11/1996 | Russell et al. | |

(Continued)

FOREIGN PATENT DOCUMENTS

| CN | 113759206 A | * | 12/2021 | |
| EP | 2535994 A2 | * | 12/2012 | ............. H02H 7/262 |

OTHER PUBLICATIONS

"Analysis of High-Impedance Fault Generated Signals Using a Kalman Filtering Approach" by Girgis, Chang and Makram, IEEE Transactions on Power Delivery, vol. 5, No. 4, Nov. 1990 (Year: 1990).*

(Continued)

*Primary Examiner* — Tarun Sinha
*Assistant Examiner* — James I Burris
(74) *Attorney, Agent, or Firm* — Lewis Roca Rothgerber Christie LLP

(57) ABSTRACT

High impedance fault (HIF) detection and location accuracy is provided. An HIF has random, irregular, and unsymmetrical characteristics, making such a fault difficult to detect in distribution grids via conventional relay measurements with relatively low resolution and accuracy. Embodiments disclosed herein provide a stochastic HIF monitoring and location scheme using high-resolution time-synchronized data in micro phasor measurement units (μ-PMUs) for distribution network protection. In particular, a fault detection and location process is systematically designed based on feature selections, semi-supervised learning (SSL), and probabilistic learning.

19 Claims, 11 Drawing Sheets

(56) References Cited

U.S. PATENT DOCUMENTS

| | | | |
|---|---|---|---|
| 2009/0157584 A1* | 6/2009 | Yang | G06F 18/2115 |
| | | | 706/46 |
| 2012/0086459 A1* | 4/2012 | Kim | G01R 31/086 |
| | | | 324/525 |
| 2017/0336465 A1* | 11/2017 | Pignati | G01R 31/088 |
| 2019/0379209 A1* | 12/2019 | Mohsenian-Rad | H02J 3/02 |
| 2020/0393505 A1 | 12/2020 | Cui et al. | |

OTHER PUBLICATIONS

Calero, F., "Rebirth of Negative-Sequence Quantities in Protective Relaying with Microprocessor-Based Relays," 57th Annual Conference for Protective Relay Engineers, Apr. 2004, College Station, Texas, USA, IEEE, 30 pages.

Vyshnavi, G. et al., "Detection and Location of High Impedance Faults in Distribution Systems: A Review," International Journal of Advanced Science and Technology, vol. 119, 2018, pp. 53-66.

Non-Final Office Action for U.S. Appl. No. 16/897,542, dated Apr. 14, 2022, 11 pages.

Benner et al., "Practical high-impedance fault detection on distribution feeders," IEEE Transaction on Industry Applications, vol. 33, No. 3; May/Jun. 1997, pp. 635-640.

Carr, J., "Detection of High Impedance Faults on Multi-Grounded Primary Distribution Systems," IEEE Transactions on Power Apparatus and Systems, vol. PAS-100, No. 4, Apr. 1981, pp. 2008-2016.

Chaderi et al., "High impedance fault detection: a review," Electric Power Systems Research, vol. 143, Feb. 2017, pp. 376-388.

Chawla et al., "SMOTE: synthetic minority over-sampling technique," Journal of Artificial Intelligence Research, vol. 16, Jun. 2002, pp. 321-357.

Choi et al., "A new fault location algorithm using direct circuit analysis for distribution systems," IEEE Transactions on Power Delivery, vol. 19, No. 1, Jan. 7, 2004, pp. 35-41.

Cui et al., "Islanding detection of hybrid distributed generation under reduced non-detection zone," IEEE Transactions on Smart Grid, vol. 9, No. 5, Mar. 7, 2017, pp. 5027-5037.

De Oliveira et al., "A new methodology for high impedance fault detection, classification and location using PMUs," 2018 Simposio Brasileiro de Sistemas Eletricos (SBSE), IEEE, May 12-16, 2018, Niteroi, Brazil, 6 pages.

Ding et al., "Transmission line parameters identification based on moving-window TLS and PMU data," 2011 International Conference on Advanced Power System Automation and Protection, IEEE, Oct. 16-20, 2011, Beijing, China, pp. 2187-2191.

Elkalashy et al., "DWT-based detection and transient power direction-based location of high-impedance faults due to leaning trees in unearthed MV networks," IEEE Transaction on Power Delivery, vol. 23, No. 1 , Dec. 26, 2007, pp. 94-101.

Elkalashy et al., "Modeling and experimental verification of high impedance arcing fault in medium voltage hetworks," IEEE Transactions on Dielectics and Electrical Insulation, vol. 14, No. 2, Apr. 10, 2007, pp. 375-383.

Emanuel et al., "High impedance fault arcing on sandy soil in 15 kV distribution feeders: contributions to the evaluation of the low frequency spectrum," IEEE Transactions on Power Delivery, vol. 5, No. 2, Apr. 1990, pp. 676-686.

Etemadi et al., "High-impedance fault detection using multi-resolution signal decomposition and adaptive neural fuzzy inference system," IET Generation, Transmission & Distribution, vol. 2, No. 1, The Institution of Engineering and Technology, Jan. 21, 2008, pp. 110-118.

Farajollahi et al., "Deployment of fault indicator in distribution networks: A MIP-based approach," IEEE Transactions on Smart Grid, vol. 9, No. 3, May 2018, pp. 2259-2267.

Farajollahi et al., "Locating the source of events in power distribution systems using micro-PMU data," IEEE Transactions on Power Systems, vol. 33, No. 6, Oct. 24, 2016, pp. 6343-6354.

Farajollahi et al., "Location identification of high impedance faults using synchronized harmonic phasors," 2017 IEEE Power & Energy Society Innovative Smart Grid Technologies Conference, Apr. 23-26, 2017, Washington, DC, 5 pages.

Gautam et al., "Detection of high impedance fault in power distribution systems using mathematical morphology," IEEE Transaction on Power Systems, vol. 28, No. 2, Sep. 24, 2012, pp. 1226-1234.

Ghaderi et al., "High-impedance fault detection in the distribution network using the time-frequency-based algorithm," IEEE Transactions on Power Delivery, vol. 30, No. 3, Oct. 3, 2014, pp. 1260-1268.

Girgis et al., "Analysis of highimpedance fault generated signals using a kalman filtering approach," IEEE Transactions on Power Delivery, vol. 5, No. 4, Oct. 1990, pp. 1714-1724.

Haghifam et al., "Development of a fuzzy inference system based on genetic algorithm for high-impedance fault detection," IEE Proceedings—Generation, Tranmission, and Distribution, vol. 153, No. 3, May 11, 2006, pp. 359-367.

Hou, D., "Detection of high-impedance faults in power distribution systems," Power Systems Conference: Advanced Metering, Protection Control, Communication, and Distributed Resources, IEEE, Mar. 13-16, 2007, Clemson, SC, pp. 85-95.

Huang et al., "A novel method of ground fault phase selection in weak-infeed side," IEEE Transactions on Power Delivery, vol. 29, No. 5, May 20, 2014, pp. 2215-2222.

IEEE Power and Energy Society, "IEEE Std C37.118.Jan. 2011: IEEE Standard for Synophasor Measurements for Power Systems," IEEE, New York, NY, Dec. 28, 2011, 61 pages.

IEEE Standards Coordinating Committee 21, "IEEE Std 1547-2018: IEEE Standard for Interconnection and Interoperability of Distributed Energy Resources with Associated Electric Power Systems Interfaces," IEEE, New York, NY, Apr. 6, 2018, 138 pages.

Jamali et al., "Fault location method for distribution networks using 37-buses distributed parameter line model," 2004 Eight IEE International Conference on Developments in Power System Protection, The Institution of Electrical Engineers, Apr. 5-8, 2004, Amsterdam, Netherlands, pp. 216-219.

Jamei et al., "Anomaly Detection Using Optimally Placed uPMU Sensors in Distribution Grids," IEEE Transactions on Power Systems, vol. 33, No. 4, Oct. 25, 2017, pp. 3611-3623.

Kamwa et al., "Compliance analysis of PMU algorithms and devices for wide-area stabilizing control of large power systems," IEEE Transaction on Power Systems, vol. 28, No. 2, Nov. 12, 2012, pp. 1766-1778.

Kamwa et al., "Wide frequency range adaptive phasor and frequency PMU algorithms," IEEE Transactions on Smart Grid, vol. 5, No. 2, Aug. 6, 2013, pp. 569-579.

Kantra et al., "Application of PMU to detect high impedance fault using statistical analysis," IEEE Power and Energy Society General Meeting, Jul. 17-21, 2016, Boston, MA, 5 pages.

Kersting et al., "Distribution Feeder Line Models," IEEE Transactions on Industry Applications, vol. 31, No. 4, Jul./ Aug. 1995, pp. 715-720.

Kim et al., "A learning method for use in intelligent computer relays for high impedance faults," IEEE Transactions on Power Delivery, vol. 6, No. 1, Jan. 1991, pp. 109-111.

Kim et al., "A parameter-based process for selecting high impedance fault detection techniques using decision making under incomplete knowledge," IEEE Transactions on Power Delivery, vol. 5, No. 3, Jul. 1990, pp. 1314-1320.

Kizilcay et al., "Digital simulation of fault arcs in power systems," European Transactions on Electrical Power, vol. 1, No. 1, Jan./Feb. 1991, pp. 55-60.

Kohavi et al., "Wrappers for feature subset selection," Artifical Intelligence, vol. 97, No. 1-2, Dec. 1997, pp. 273-324.

Kwon et al., High impedance fault detection utilizing incremental variance of normalized even order harmonic power, IEEE Transactions on Power Delivery, vol. 6, No. 2, Apr. 1991, pp. 557-564.

Laaksonen et al., "Method for high-impedance fault detection," 24th International Conference & Exhibition on Electricity Distribution (CIRED)—Open Access Proceedings Journal, vol. 2017, No. 1, The Institution of Engineering and Technology, Jun. 12-15, 2017, pp. 1295-1299.

(56) References Cited

OTHER PUBLICATIONS

Lai et al., "High-impedance fault detection using discrete wavelet transform and frequency range and RMS conversion," IEEE Transactions on Power Delivery, vol. 20, No. 1, Jan. 2005, pp. 397-407.
Li et al., "Transient stability prediction based on apparent impedance trajectory recorded by PMUs," International Journal of Electrical Power & Energy Systems, vol. 54, Jan. 2014, pp. 498-504.
Iurinic et al., "Distribution systems high-impedance fault location: A parameter estimation approach," IEEE Transactions on Power Delivery, vol. 31, No. 4, Dec. 17, 2015, pp. 1806-1814.
Macedo et al., "Proposition of an interharmonic-based methodology for high-impedance fault detection in distribution systems," IET Generation, Transmission, and Distribution, The Institution of Enerineering and Technology, vo., 9, No. 16, Nov. 30, 2015, pp. 2593-2601.
Milioudis et al., "Detection and location of high impedance faults in multiconductor overhead distribution lines using power line communication devices," IEEE Transactions on Smart Grid, vol. 6, No. 2, Nov. 12, 2014, pp. 894-902.
Niu et al., "Squared-loss Mutual Information Regularization: A Novel Information-theoretic Approach to Semi-supervised Learning," Proceedings of Machine Learning Research, vol. 28, No. 3, International Conference on Machine Learning, Jun. 17-19, 2013, Atlanta, GA, pp. 10-18.
Nunes et al., "Distribution systems high impedance fault location: A spectral domain model considering parametric error processing, " Electrical Power and Energy Systems, vol. 109, Jul. 2019, 227-241.
Parikh et al., "SVR-based current zero estimation technique for controlled fault interruption in the series-compensated transmission line," IEEE Transactions on Power Delivery, vol. 28, No. 3, May 3, 2013, pp. 1364-1372.
Pignati et al., "Fault detection and faulted line identification in active distribution networks using synchrophasors-based real-time state estimation," IEEE Transaction on Power Delivery, vol. 32, No. 1, Mar. 23, 2016, pp. 381-392.
Radil et al., "Methods for Estimation of Voltage Harmonic Components," chapter 13, Power Quality, InTech, London, U.K., Apr. 2011, pp. 255-270.
Sagastabeitia et al., "Low-current fault detection in high impedance grounded distribution networks, using residual variations of asymmetries," IET Generation, Tranmission, and Distribution, The Institution of Engineering and Technolog, vol. 6, No. 12, Dec. 2012, pp. 1252-1261.
Sahoo et al., "A method to detect high impedance faults in distribution feeders," IEEE PES T&D Conference and Exposition, Apr. 14-17, 2014, Chicago, IL, 6 pages.
Sarlak et al., "High-impedance faulted branch identification using magnetic-field signature analysis," IEEE Transactions on Power Delivery, vol. 28, No. 1, Nov. 27, 2012, pp. 67-74.
Schweitzer Engineering Laboratories, Inc. "SEL-421 Relay Protection and Automation Instruction Manual Applications Handbook," Jun. 27, 2013, 372 pages.
Schweitzer Engineering Laboratories, Inc., "Arc Sense Technology (AST): High-Impedance Fault Detection," 2016, 10 pages, available online:https://cdn.selinc.com/assets/Literature/Product%20Literature/Flyers/Arc-Sense_PF00160.pdf?v=20161031-073656.
Sedighi et al., "High impedance fault detection based on wavelet transform and statistical pattern recognition," IEEE Transaction on Power Delivery, vol. 20, No. 4, Oct. 3, 2005, pp. 2414-2421.
Sheng et al., "Decision tree-based methodology for high impedance fault detection," IEEE Transactions on Power Delivery, vol. 19, No. 2, Mar. 30, 2004, pp. 533-536.
Stewart et al., "Open μPMU: A real world reference distribution micro-phasor measurement unit data set for research and application development," LBLN-1006408, Lawrence Berkeley National Laboratory, Berkeley, CA, Oct. 2016, 4 pages.
Sultan et al., "Detection of high impedance arcing faults using a multi-layer perceptron," IEEE Transactions on Power Delivery, vol. 7, No. 4, Oct. 1992, pp. 1871-1877.
Sze et al., "Hardware for machine learning: Challenges and opportunities," IEEE Custom Integrated Circuits Conference (CICC), Apr. 30-May 3, 2017, Austin, TX, 8 pages.
Tengdin et al., "High Impedance Fault Detection Technology," Report of Power Stystem Relaynig and Control Committee Working Group D15, IEEE Power and Energy Society, Mar. 1, 1996, 12 pages.
VIZIMAX Inc., "Phasor Measurement Unit (PMU) Datasheet: PMU01000," Sep. 18, 2017, 38 pages.
Von Meier et al., "Precision micro-synchrophasors for distribution systems: A summary of applications," IEEE Transactions on Smart Grid, vol. 8, No. 6, Jun. 28, 2017, pp. 2926-2936.
Wai et al., "A novel technique for high impedance fault identification," IEEE Transactions on Power Delivery, vol. 13, No. 3, Jul. 1998, pp. 738-744.
Yu et al., "An adaptive high and low impedance fault detection method," IEEE Transactions on Power Delivery, vol. 9, No. 4, Oct. 1994, pp. 1812-1821.
Zhang et al., "Model-based general arcing fault detection in medium-voltage distribution lines," IEEE Transactions on Power Delivery, vol. 31, No. 5, Jan. 25, 2016, pp. 2231-2241.
Zhao et al., "A framework for robust hybrid state estimation with unknown measurement noise statistics," IEEE Transactions on Industrial Informatics, vol. 14, No. 5, Oct. 19, 2017, pp. 1866-1875.
Zhou et al., "Partial knowledge data-driven event detection for power distribution networks," IEEE Transactions on Smart Grid, vol. 9, No. 5, Mar. 13, 2017, pp. 5152-5162.
Zhu et al., "Automated fault location and diagnosis on electric power distribution feeders," IEEE Transactions on Power Delivery, vol. 12, No. 2, Apr. 1997, pp. 801-809.
Zhuang, D., "Real time testing of intelligent relays for synchronous distributed generation islanding detection," Master's Thesis, Department of Electrical and Computer Engineering, McGill University, Montreal, Quebec, Mar. 2012, 110 pages.
Cui et al., "Enhance High Impedance Fault Detection and Location Accuracy via μ-PMUs" IEEE Transactions on Smart Grid, vol. 11, No. 1, Jan. 2020, pp. 797-809.
Powerside "microPMU" Data Sheet, powerside.com, 2020, 2 pages.
Witten et al. "Data Mining: Practical Machine Learning Tools and Techniques" Elsevier, Second Edition, 2005, 558 pages.
Witten et al. "Data Mining: Practical Machine Learning Tools and Techniques" Elsevier, Second Edition, 2016, 642 pages.
Quayle Action for U.S. Appl. No. 16/897,542, mailed Oct. 7, 2022, 5 pages.
Notice of Allowance for U.S. Appl. No. 16/897,542, dated Feb. 15, 2023, 8 pages.

* cited by examiner

HIGH IMPEDANCE FAULT DETECTION AND LOCATION ACCURACY

RELATED APPLICATIONS

This application claims the benefit of provisional patent application Ser. No. 63/039,215, filed Jun. 15, 2020, the disclosure of which is hereby incorporated herein by reference in its entirety.

FIELD OF THE DISCLOSURE

The present disclosure relates to high impedance fault (HIF) detection in power distribution systems.

BACKGROUND

High impedance faults (HIFs) normally exist in power distribution systems with voltages ranging from 4 kilovolts (kV) to 34.5 kV. Upon the occurrence of an HIF, its immediate vicinity is imposed with potential danger, which is hazardous to public safety. For such reasons, researchers and engineers have been exploring novel ways to detect HIFs since the 1970s. Many algorithms aim at enhancing conventional relays at the early stage. They propose methods such as proportional relaying algorithm, impedance-based method, and PC-based fault locating and diagnosis algorithm, etc. However, two critical issues hinder HIF detection performance: measurement accuracy and information extraction capability. Due to these reasons, it was revealed in one case study that conventional protection cleared only 17.5% of staged HIFs. Specifically, existing commercial microprocessor-based relays rely on threshold constructed by direct physical measurements, making detection logic exhibit unsatisfactory performances.

SUMMARY

High impedance fault (HIF) detection and location accuracy is provided. An HIF has random, irregular, and unsymmetrical characteristics, making such a fault difficult to detect in distribution grids via conventional relay measurements with relatively low resolution and accuracy. Embodiments disclosed herein provide a stochastic HIF monitoring and location scheme using high-resolution time-synchronized data in micro phasor measurement units (µ-PMUs) for distribution network protection.

In particular, a fault detection and location process is systematically designed based on feature selections, semi-supervised learning (SSL), and probabilistic learning. For example, a wrapper method is proposed to leverage output data in feature selection to avoid overfitting and reduce communication demand. To utilize unlabeled data and quantify uncertainties, an SSL-based method is proposed using information theory for fault detection. For location, a probabilistic analysis is proposed via moving window total least square based on the probability distribution of the fault impedance. An evaluation platform based on a real-time simulator is used for numerical validation, so that the real-time property of a µ-PMU can be examined. This evaluation shows enhanced HIF detection and location, when compared to traditional methods.

An exemplary embodiment provides an HIF monitoring system, comprising: a feature extractor, configured to: receive power measurements from a plurality of sensors in a power distribution system; and extract an effective feature set (EFS) for detecting an HIF from the power measurements; and an HIF detector configured to determine occurrence of an HIF using machine learning and the EFS.

Another exemplary embodiment provides a method for detecting and locating an HIF, the method comprising: receiving power measurements from a power distribution system; extracting a power feature indicative of HIF occurrence from the power measurements; determining occurrence of an HIF based on the power feature; and determining a probable location of the HIF based on the power measurements.

Another exemplary embodiment provides a phasor data concentrator (PDC) for a power distribution system, the PDC comprising: a network interface; a memory configured to store power measurements received over the network interface from a plurality of sensors in the power distribution system; and an HIF monitor connected to the memory and comprising: feature extraction logic configured to extract an EFS for detecting an HIF from the power measurements; and HIF detection logic configured to determine occurrence of an HIF using the EFS; and HIF location logic configured to determine a probable location of the HIF based on an output of the HIF detection logic.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
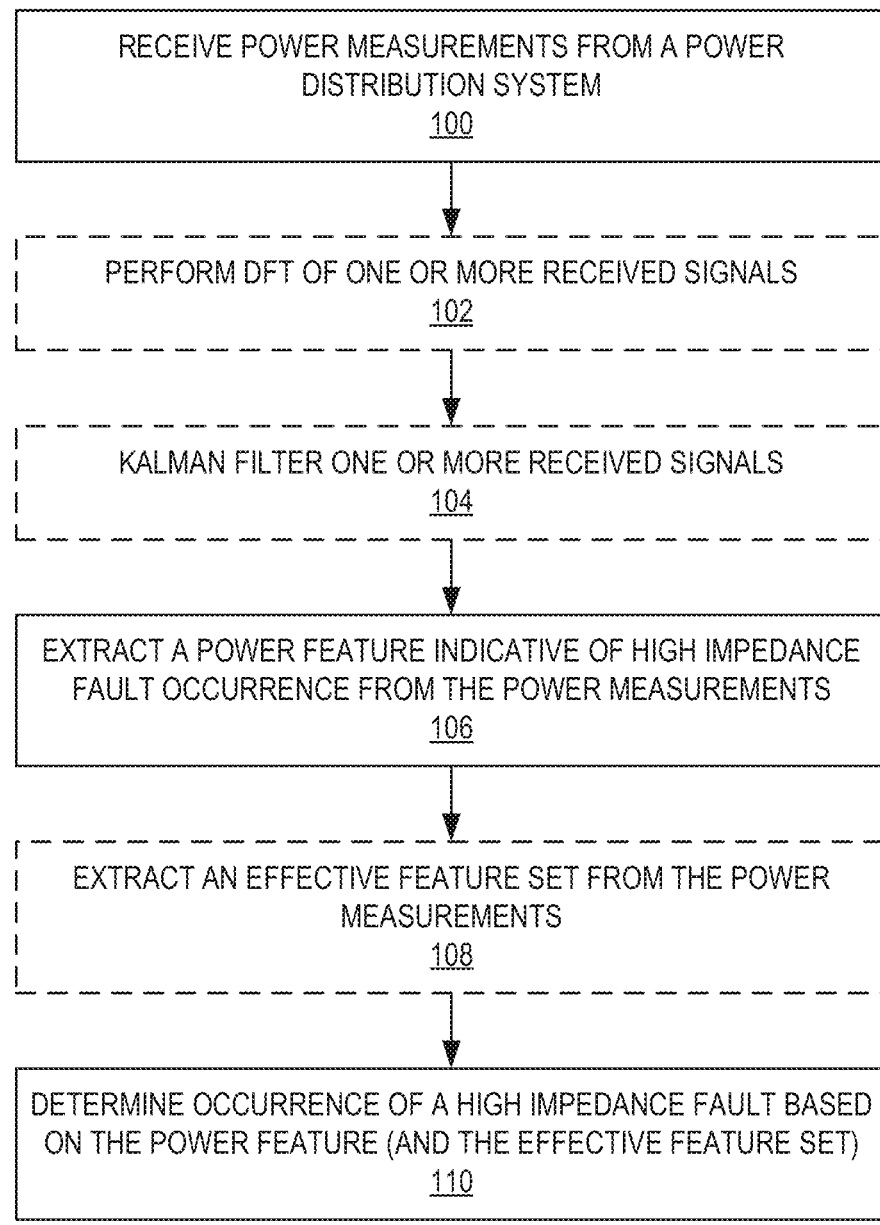
FIG. 1 is a flow diagram illustrating a process for detecting and locating a high impedance fault (HIF), which may be implemented by an HIF monitor or another appropriate processing device.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

High impedance fault (HIF) detection and location accuracy is provided. An HIF has random, irregular, and unsymmetrical characteristics, making such a fault difficult to detect in distribution grids via conventional relay measurements with relatively low resolution and accuracy. Embodiments disclosed herein provide a stochastic HIF monitoring and location scheme using high-resolution time-synchronized data in micro phasor measurement units (μ-PMUs) for distribution network protection.

In particular, a fault detection and location process is systematically designed based on feature selections, semi-supervised learning (SSL), and probabilistic learning. For example, a wrapper method is proposed to leverage output data in feature selection to avoid overfitting and reduce communication demand. To utilize unlabeled data and quantify uncertainties, an SSL-based method is proposed using information theory for fault detection. For location, a probabilistic analysis is proposed via moving window total least square based on the probability distribution of the fault impedance. An evaluation platform based on a real-time simulator is used for numerical validation, so that the real-time property of a μ-PMU can be examined. This evaluation shows enhanced HIF detection and location, when compared to traditional methods.

I. Introduction

For measurement accuracy, μ-PMUs are becoming available in distribution grids, capable of providing HIF detection devices with high-precision and high-resolution measurements. For example, multiple utility and campus locations have μ-PMUs installed in the distribution systems to enable further research. With the data streams, phasor data concentrators (PDCs) can conduct data analytics algorithms for capturing distinct characteristics of HIFs. Therefore, a framework is designed for a highly accurate data-driven HIF monitoring and location scheme based on μ-PMUs for distribution network protection. Specifically, a process is systematically designed based on feature selections, SSL, and probabilistic learning for fault detection and location.

For feature selection, the aim is reducing feature numbers to avoid overfitting and reduce communication demand. As μ-PMU data provides high-precision time-stamped measurements and synchronized data aggregation from multiple locations, the data is used to extract hidden information by considering three factors in the features: 1) how large the physical quantity becomes, 2) how fast the signal changes, and 3) how strong the harmonics are. "How large" means that the selected features need to include a signal magnitude from a discrete Fourier transform (DFT) over cycles. "How fast" considers the first-order derivative of time series data. As for "how strong each harmonic is," it means the adopted feature needs to embed harmonic information derived from data (e.g., phasor measurements) from the μ-PMUs. After information extraction, features are ranked via a wrapper method (rather than a filter method) to leverage output data in feature selection to keep a balance between information gain on selected features and complexity to avoid overfitting.

After feature selection, supervised learning can be conducted directly to obtain the HIF results. Some machine learning approaches have been proposed previously (e.g., expert systems based on artificial intelligence, Bayes classifier, nearest neighborhood rule, decision tree learning, neural networks, fuzzy inference). However, these machine learning methods have a strong requirement on the labeled dataset, which may not be widely available for HIF. In addition, there are always fault or non-fault events that are never seen by the classifier. Finally, recording the events and correctly labeling them is a slow and mostly non-existent process in utility companies.

Therefore, this disclosure focuses on using unlabeled data and quantifying uncertainties for HIF. For this purpose, an SSL-based method is proposed using information theory for maximizing accuracy of HIF fault detection. A mathematical model of the HIF is investigated, and a binary classification method is proposed for traditional HIF detection with a fault current ranging from 10 to 50 amps (A). Moreover, the wrapper approach is adopted to extract features from a systematically designed pool with many practical and reliable features widely used in microprocessor-based relays.

For fault location, a variety of methods have been proposed based on μ-PMU data (e.g., using compensation theorem, synchrophasor-based state estimation). Embodiments described herein introduce an HIF location method according to the probability output of the SSL method and the HIF impedance probability distribution. For example, a probabilistic analysis is proposed via a moving window total least square based on the probability distribution of the fault impedance.

Finally, a real-time simulator is used for validation, which helps to verify the effectiveness of using real-time μ-PMU measurements. For example, an evaluation platform is set up based on the real-time OPAL-RT simulator, so that the real-time property of μ-PMU can be examined. This evaluation shows enhanced HIF detection and location capability when compared to traditional methods.

Section II elucidates the proposed method, including the feature selection method for HIF detection, the information-theoretic SSL method, and the probabilistic method for HIF location. The three methods are then combined and an implementation scheme is proposed in Section III. The evaluation results are presented in Section IV, followed by discussions in Section V. Section VI explains the hardware evaluation. Section VII provides additional details of the HIF model used, and Section VII provides an example of HIF location calculation.

II. HIF Monitoring and Alarm Scheme

The proposed HIF monitoring and alarm scheme comprises three key factors in HIF detection and location: feature engineering, data classification, and fault location.

FIG. 1 is a flow diagram illustrating a process for detecting and locating an HIF, which may be implemented by an HIF monitor (e.g., as further described below with respect to an HIF monitoring system in FIG. 6) or another appropriate processing device (e.g., a microprocessor, field programmable gate array (FPGA), digital signal processor (DSP), application-specific integrated circuit (ASIC), or other programmable logic device, discrete gate or transistor logic, discrete hardware components, or any combination thereof). Dashed boxes represent optional steps.

The process begins at operation 100, with receiving power measurements from a power distribution system (e.g., from one or more μ-PMUs). The process optionally continues at operation 102, with performing a DFT of one or more received signals (e.g., a received voltage signal and/or current signal). The process optionally continues at operation 104, with Kalman filtering the one or more received signals (e.g., the received voltage signal and/or the received current signal).

The process continues at operation 106, with extracting a power feature indicative of HIF occurrence (e.g., an angle difference between a negative sequence voltage and a zero sequence voltage ($\theta_{V_2}-\theta_{V_0}$)) from the power measurements. The process optionally continues at operation 108, with extracting an effective feature set (EFS) from the power measurements. Selection of the power feature(s) and EFS is further described in sub-section A. The process continues at operation 110, with determining occurrence of an HIF based on the power feature (optionally based on the EFS).

Although the operations of FIG. 1 are illustrated in a series, this is for illustrative purposes and the operations are not necessarily order dependent. Some operations may be performed in a different order than that presented. Further, processes within the scope of this disclosure may include fewer or more steps than those illustrated in FIG. 1.

A. Feature Selection for HIF Detection

For regular fault detection in power systems, the voltage and current are ideal features since they capture most of the variance from current transformer (CT) and potential transformer (PT) measurements of the μ-PMUs. Unlike regular faults, HIFs face challenges in identifying effective features due to the randomness of impedance. Therefore, past works focus on proposing different features from the time/frequency domain for indicating HIF. However, these studies could not assess the effectiveness of their proposed features in contrast with other features.

To resolve this issue, a feature pool is created using various features from different proposals to form a large dataset containing HIF and non-HIF event data (the details of the dataset can be found in Section III-A). To determine a relevant subset of features (e.g., an EFS), feature subset selection is conducted. The objective is to find an optimal subset of features that generates the highest possible classification accuracy. Selection of the EFS is discussed further below and in related patent application Ser. No. 16/897,542, filed Jun. 10, 2020, published as U.S. Patent Application Publication No. 2020/0393505 A1, the disclosure of which is hereby incorporated herein by reference in its entirety.

Figure 2:
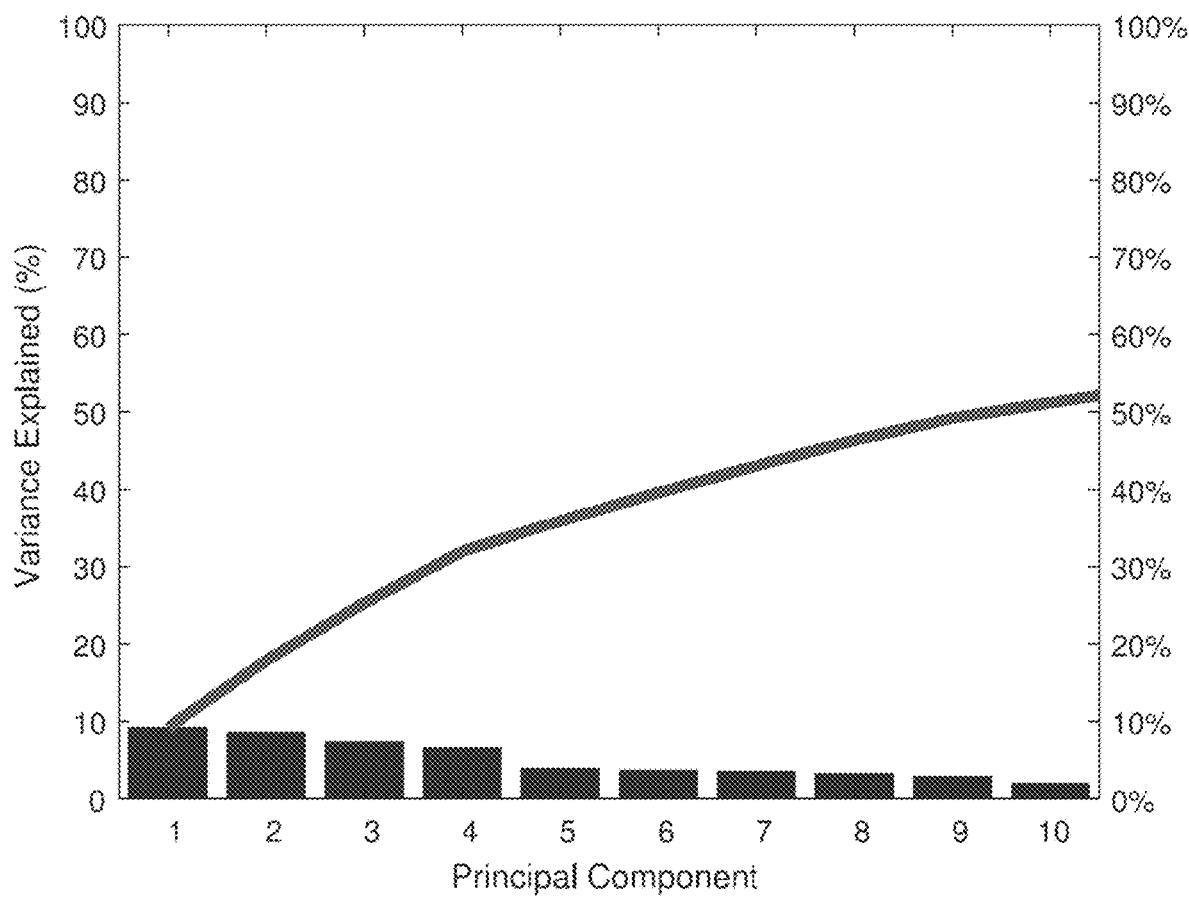
FIG. 2 is a graphical representation of the percentage of variance explained by the top ten principal components used in prior approaches to HIF detection.

FIG. 2 is a graphical representation of the percentage of variance explained by the top ten principal components used in prior approaches to HIF detection. The top ten principal components provide only 52% of the data information. This means that many of the proposed detection features are not useful when competing in the feature pool, calling for an enhanced feature selection method for HIF detection.

Since HIFs are associated with different contact surfaces, moisture, temperatures, and locations, there is an extremely large number of parameter combinations when translated to the mathematical or simulation models of HIFs. For example, 200 features have 2200 possibilities for the feature set. Therefore, it is impossible to conduct simulations and evaluations to cover all scenarios of HIFs and label them accordingly. This means that the cost if a filter approach is adopted in feature selection (e.g., looking into the input only) is very high. Therefore, another key approach is adopted in feature selection, namely a wrapper approach.

Figure 3A:
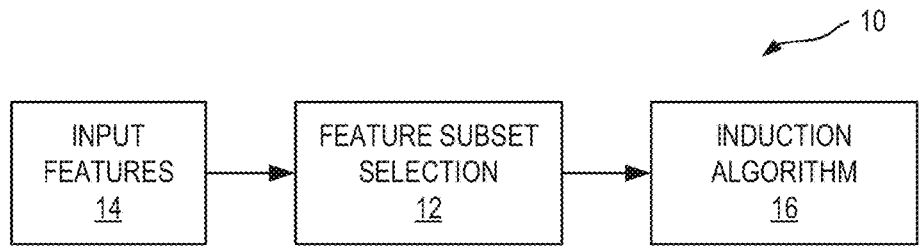
FIG. 3A is a schematic block diagram of a filter approach to feature subset selection.

FIG. 3A is a schematic block diagram of a filter approach 10 to feature subset selection 12. Specifically, the filter approach 10 attempts to assess the merits of input features 14 only from the data, ignoring an induction algorithm 16, which is used to induce a classifier that maps the space of feature values to the set of class values. For example, the classifier can be decision trees, support vector machines, etc. The resulting feature subset cannot guarantee good performance of the induction algorithm 16.

Figure 3B:
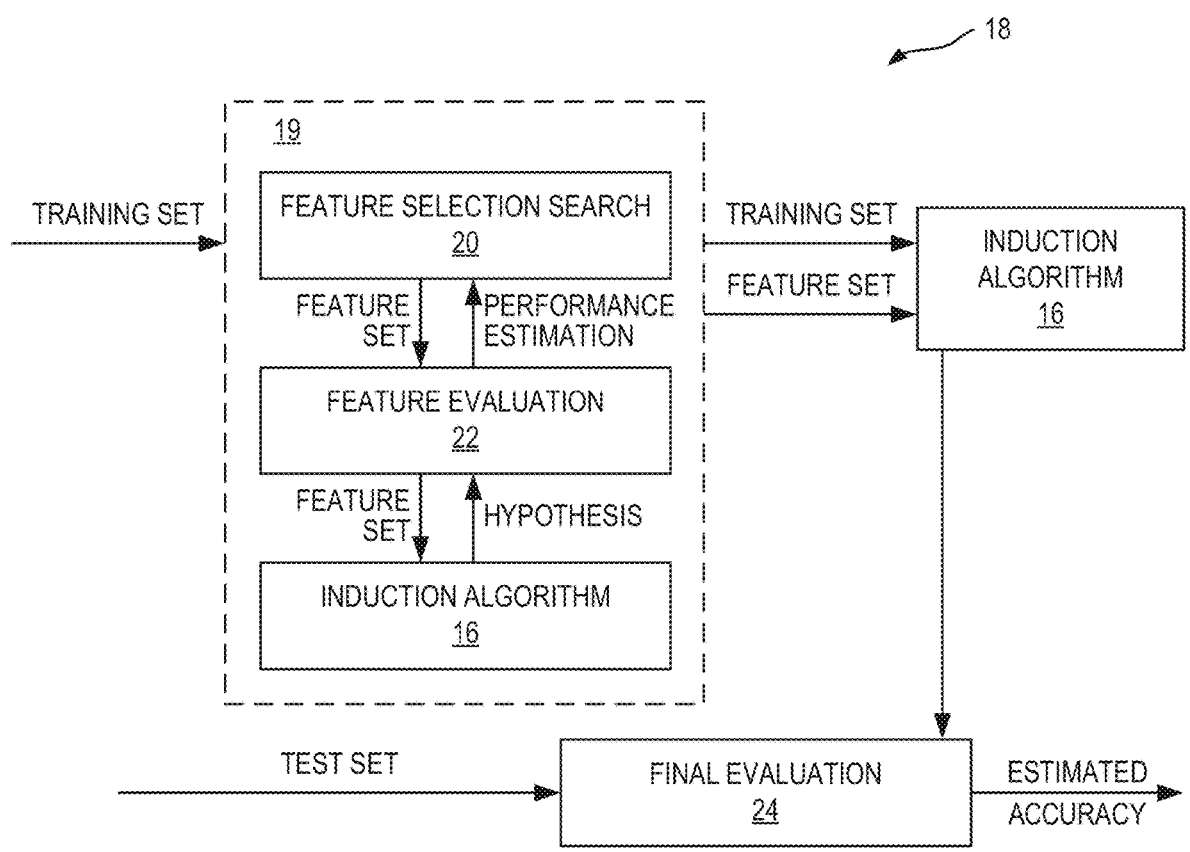
FIG. 3B is a schematic block diagram of a wrapper approach to feature subset selection for embodiments of the HIF detection and location process of FIG. 1.

FIG. 3B is a schematic block diagram of a wrapper approach 18 to feature subset selection for embodiments of the HIF detection and location process of FIG. 1. The wrapper approach 18 evaluates the selection of the feature subset (e.g., the EFS) using the induction algorithm 16 itself as part of a function 19 evaluating feature subsets. During data training, different feature sets are evaluated with the help of a feature selection search 20, feature evaluation 22, and induction algorithm 16 blocks. Feature evaluation 22 estimates the performance of a certain feature set and updates the feature selection search 20 algorithm with the current best feature set. It is noteworthy that the performance estimation refers to the accuracy estimation technique that estimates the accuracy of the induction algorithm 16.

Embodiments described herein adopt the cross-validation (CV) technique for final evaluation 24, the details of which are explained in Section III-A(2). Furthermore, the induction algorithm 16 prepares the feature evaluation 22 with the optimal parameters in a corresponding hypothesis, which is a function that can best classify the training data. Since the induction algorithm 16 is wrapped into the selection procedure, this approach is more suitable to the proposed setup.

B. Semi-Supervised Learning (SSL) for HIF Detection

After feature extraction, a supervised learning approach can be applied for HIF detection. However, the performance of supervised learning relies on the number of labeled HIF events in the past, which may not be sufficient. For this reason, SSL is employed to incorporate data from unseen events, so that only a small number of events need to be labeled. Table I shows a comparison of the required dataset among unsupervised learning, supervised learning, and SSL. As a highlight, SSL only requires a few labeled observations and can improve performance significantly by adding a large number of unlabeled observations, which is cheap to obtain.

TABLE I

| Category | Input dataset | Labeling |
| --- | --- | --- |
| Unsupervised Learning | $X = [x_1, \ldots, x_n]^T$ | $Y \in \emptyset$ |
| Supervised Learning | $X = [x_1, \ldots, x_n]^T$ | $Y \in \mathbb{R}^{n \times 1}$ |
| Semi-Supervised Learning | $X = [x_1, \ldots, x_l, \ldots, x_{l+u}]^T$ | $Y \in \mathbb{R}^{l \times 1}$ |

$x_i = [x_1, x_2, \ldots, x_d]$, $i \in N$, $X \in \mathbb{R}^{n \times d}$, where n denotes the number of observations and d denotes the number of features. $l + u = n$, usually $l < u$, where l denotes the number of labeled observations and u denotes the number of unlabeled observations.

To utilize both labeled and unlabeled datasets, there are many SSL methods. Two popular methods are self-training and co-training approaches, where self-training makes the classifier use its own predictions to train itself, while co-training employs two classifiers to train each other with the most confident prediction labels they feel. Embodiments use self-training since HIF detection does not need two classifiers in co-training. For such training, embodiments need to choose among generative probabilistic models and discriminative models.

For generative probabilistic, Gaussian mixture model is calculated between the observation and the label. The objective function attempts to learn the parametric vector $\theta$ through $\hat{\theta} = \arg\max_\theta (\log P(Y_L | X_L; \theta) + \alpha \log P(X_U; \theta))$, where $X_L = [x_1, \ldots, x_l]^T$, $X_U = [x_{l+1}, \ldots, x_{l+u}]^T$ $Y_L = [y_1, \ldots, y_l]^T$. The first term is related to the posterior class probability of the labeled data. The second term introduces the log likelihood of the unlabeled data, with the weight $\alpha$.

However, such an approach requires joint distribution, which is not available and hard to obtain due to the complicated relationship between input feature data and the output labels of HIF. This is because discriminative models focus on the conditional probability and attempt to "discriminate" the value of the label given the observation. For the discriminative model, the information-theoretic SSL method is adopted, because 1) it is built upon probabilistic description for the randomness of impedance in HIF, 2) it uses powerful metric such as mutual information based on previously selected features, and 3) it guarantees the globally optimal solution which means dependability in protection.

Specifically, the deployed method relies on square-loss mutual information regularization. Two useful objectives are offered in the method, namely the analytic expression of the globally optimal solution and the probabilistic values to determine HIFs. Consider a d-dimensional dataset $X \subseteq \mathbb{R}^d$ and $Y = \{1, \ldots, c\}$ where c denotes the number of classes for HIF. Assume i.i.d. $\{(x_i, y_i)_{i=1}^l\}$ and $\{(x_i)_{i=l+1}^n\}$ with $n = l + u$ and $l < u$, where the former represents the labeled dataset, and the later represents the dataset without labels.

The goal of the proposed SSL method for HIF is to classify any $x \in X$ achieving $y = \arg\max_{y \in Y} p(y|x)$. Initially, a uniform class-prior probability $p(y) = 1/c$ is assumed. Then, the class-posterior probability is approximated with $q(y|x; \alpha): = \langle K^{-1/2} \Phi_n(x), D^{-1/2} \alpha_y \rangle$, where kernel $k: X \times X \mapsto \mathbb{R}$, kernel matrix $K \in \mathbb{R}^{n \times n}$, the empirical kernel map $\Phi_n: X \mapsto \mathbb{R}^n$, $x \mapsto (k(x, x_1), \ldots, k(x, x_n))^T$, the degree matrix $D = \text{diag}(d_1, \ldots, d_n)$ with $d_i = \sum_{j=1}^n k(x_i, x_j)$, the model parameter $\alpha = \{\alpha_1, \ldots, \alpha_c\}$ and $\alpha_u = (\alpha_{y,1}, \ldots, \alpha_{y,n})^T$. Consequently, the optimization problem in this particular SSL method is formulated as:

$$\min_{\alpha_1, \ldots, \alpha_c \in \mathbb{R}^n} \Delta(p, q) - \gamma \widehat{SMI} + \lambda \Sigma_{y \in Y} 1/2 \|\alpha_y\|_2^2 \qquad \text{Equation 1}$$

where the loss function is defined as the squared-difference of probabilities p and q: $\Delta(p, q) = 1/2 \int_X \Sigma_{y \in Y} (p(y|x) - q(y|x; \alpha))^2 p(x) dx$, the squared-loss mutual information (SMI) is given by $$\widehat{SMI} = \frac{c}{2n} tr(A^T D^{-1/2} K D^{-1/2} A) - \frac{1}{2},$$

and $tr(\cdot)$ is the trace operator, $A = (\alpha_1, \ldots, \alpha_c) \in \mathbb{R}^{n \times c}$, $\gamma, \lambda > 0$ are the regularization parameters.

C. A Probabilistic Method for HIF Location

After SSL-based detection, the fault needs to be located. The location function utilizes the probability output of the SSL-based HIF detection algorithm, then ranks the prediction probability to narrow down the faulty zones. Through the probabilistic fault location estimation method which will be elucidated below, the estimated HIF location range is obtained using μ-PMU data.

Figure 4:
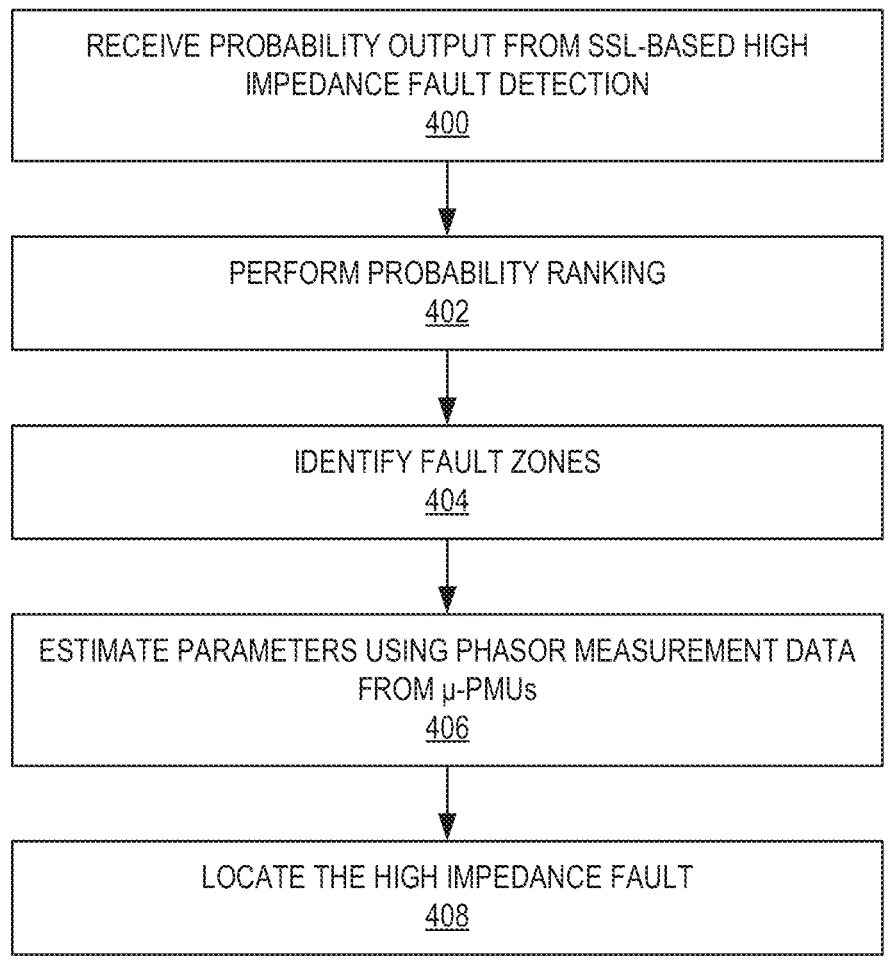
FIG. 4 is a flow diagram illustrating a process for locating an HIF, which may be implemented in the HIF detection and location process of FIG. 1.

FIG. 4 is a flow diagram illustrating a process for locating an HIF, which may be implemented in the HIF detection and location process of FIG. 1 (e.g., and as further described below with respect to the HIF monitoring system in FIG. 6). The process begins at operation 400, with receiving a probability output from the SSL-based HIF detection. The process continues at operation 402, with performing a probability ranking of the HIF prediction. The process continues at operation 404, with identifying candidate fault zones (narrowed down using the ranking). The process continues at operation 406, with estimating parameters using phasor measurement data from the μ-PMUs. The process continues at operation 408, with locating the HIF.

Figure 5A:
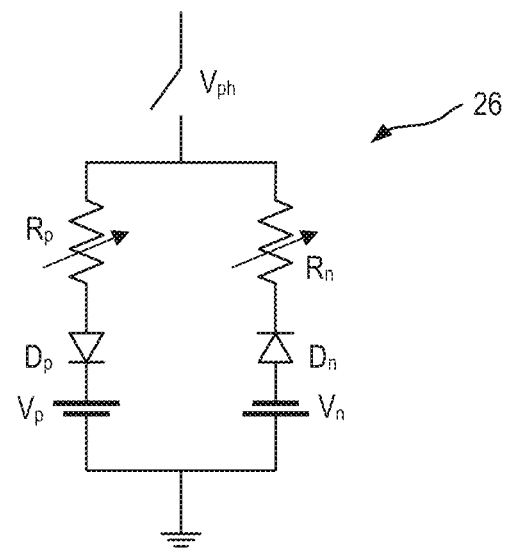
FIG. 5A is a schematic diagram of an HIF model using two anti-parallel direct current (DC) sources.

FIG. 5A is a schematic diagram of an HIF model 26 using two anti-parallel direct current (DC) sources $V_p$, $V_n$. The HIF model 26 is one of several available approaches and is included for illustrative purposes. The HIF model 26 connects one phase of a power line to ground. The HIF model 26 includes two parallel branches, each with a variable resistor $R_p$, $R_n$, a diode $D_p$, $D_n$, and a DC source $V_p$, $V_n$. The two variable resistors $R_p$, $R_n$ are both changing randomly, modeling dynamic arcing resistance. The two sets of diodes $D_p$, $D_n$ and DC sources $V_p$, $V_n$ are connected in an anti-parallel configuration. The two DC sources $V_p$, $V_n$ are randomly varying as well, which model the asymmetric nature of an HIF. A positive half cycle of HIF current is achieved when $V_{ph} > V_p$, while a negative half cycle is achieved when $V_{ph} < V_n$. When $V_n < V_{ph} < V_p$, the current equals zero, which represents a period of arc extinction. Test results of this HIF model 26 indicate good modeling performance and are validated in simulation and field test results.

Originally, the relationship between a one-terminal measurement and fault location is formulated using a constant-impedance constant-DC-source HIF model. Since constant impedance and DC source are assumed, the deployed HIF model in traditional approaches cannot well represent the random phenomenon of fault impedance during arcing. Moreover, conventional solutions have limitations on measurement location, device, and accuracy. To solve these issues, randomness is introduced to the HIF model 26 and the HIF location system is set up in the μ-PMU environment.

Figure 5B:
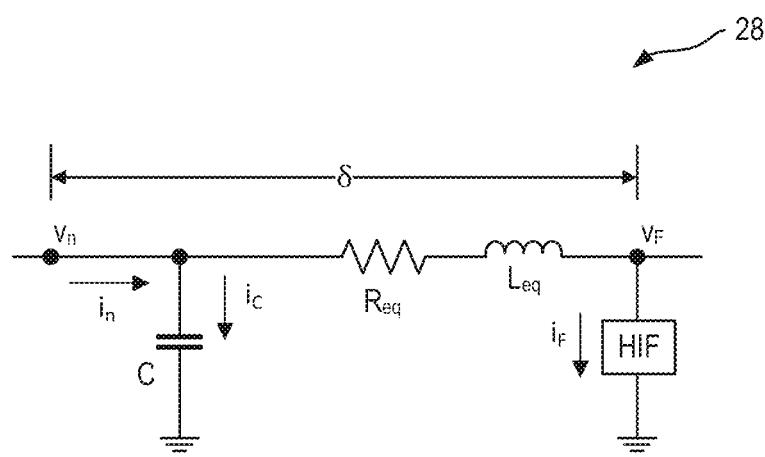
FIG. 5B is a single line schematic diagram of a one-terminal measurement system for the HIF model of FIG. 5A.

FIG. 5B is a single line schematic diagram of a one-terminal measurement system 28 for the HIF model 26 of FIG. 5A. The left-hand side terminal has the voltage values of $V_n$, denoting the nth μ-PMU measurement. Depending on the location of the HIF fault, the equivalent line impedance $R_{eq} + j\omega L_{eq}$ is equal to the distance δ times the per-unit-length line resistance, inductance. To simplify the calculation, the shunt capacitance is lumped at the measurement terminal, consuming the current of $i_C$. $v_F$ and $i_F$ are the HIF voltage and current.

Assuming that R, L, and C represent the per-unit-length resistance, inductance, and capacitance, therefore, applying Kirchhoff's voltage law (KVL) to the circuit in FIG. 5B yields:

$$v_n = \delta R(i_n - i_C) + \delta L \frac{d(i_n - i_C)}{dt} + v_F \qquad \text{Equation 2}$$

where $v_n$ and $i_n$ are terminal voltage and current measurements, and $v_F$ is the voltage at the fault point. According to the HIF model in FIG. 5A, the fault voltage is given in two cases:

$$v_F = \begin{cases} i_F R_p + V_p, & i_F \geq 0 \\ i_F R_n - V_n, & i_F < 0 \end{cases} \qquad \text{Equation 3}$$

In underground cable networks, the line capacitance C is the major source of error in fault location. However, in overhead line applications with which HIF is associated, the shunt capacitance can be neglected without generality in the distribution lines. Therefore $$i_C = \delta C \frac{dV_n}{dt} \approx 0.$$

In addition, combining the two cases in one equation, and replacing Equation 3 in Equation 2 gives:

$$v_n = \delta \left( R i_n - L \frac{di_n}{dt} \right) + R_F i_F + V_{DC} \qquad \text{Equation 4}$$

where $R_F$ and $V_{DC}$ have their positive and negative cycle values of $R_p$, $R_n$ and $V_p$, $(-V_n)$ respectively.

The fault current ($i_F$) estimation method is adopted to estimate the distance value of the HIF, then the moving window total least square method is used to estimate the variables of δ, $R_F$, and $V_{DC}$ at the positive and negative cycles. Note that $v_n$ and $i_n$ are directly from μ-PMU data, and that $$\frac{di_n}{dt}$$

is derived from μ-PMU current data. From Equation 4, this yields:

$$\begin{cases} R_p = c_{p1}\delta + c_{p0}, & i_F < 0 \\ R_n = c_{n1}\delta + c_{n0}, & i_F > 0 \end{cases} \text{ where} \qquad \text{Equation 5}$$

$$c_{p1} = -\frac{1}{i_F}\left(Ri_n - L\frac{di_n}{dt}\right), c_{p0} = \frac{v_n - V_p}{i_F},$$

$$c_{n1} = \frac{1}{i_F}\left(Ri_n - L\frac{di_n}{dt}\right), \text{ and } c_{n0} = -\frac{v_n + V_n}{i_F}.$$

To better understand how the fault location is computed, a simple example is provided in Section VIII.

III. Implementation Scheme

Figure 6:
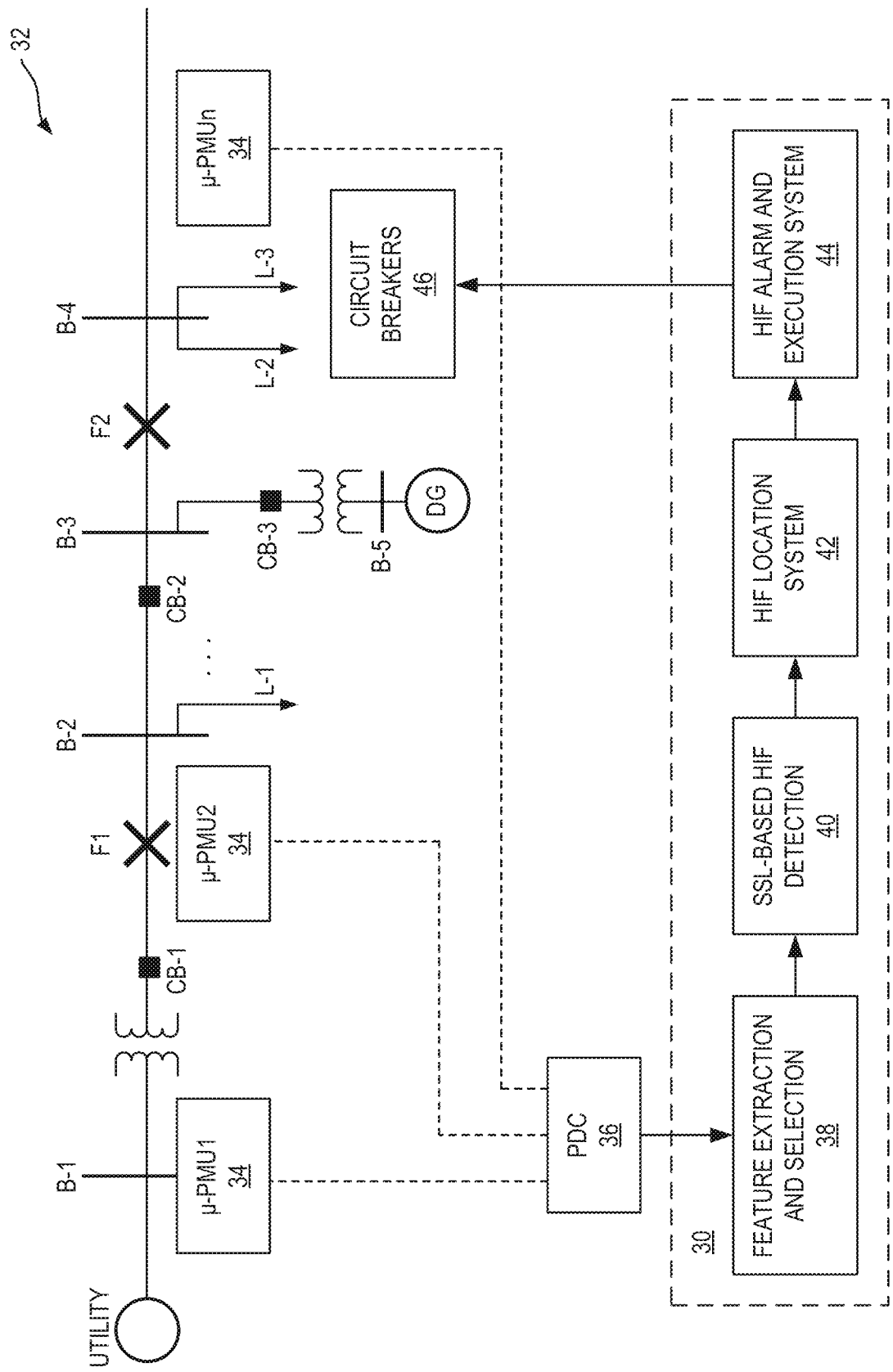
FIG. 6 is a schematic block diagram of an HIF monitoring system for detecting and locating an HIF according to embodiments described herein.

FIG. 6 is a schematic block diagram of an HIF monitoring system 30 for detecting and locating an HIF according to embodiments described herein. The HIF monitoring system 30 can be implemented in a power distribution system 32 with μ-PMUs 34 installed along the feeder and one or more PDCs 36 connect the data for the HIF monitoring system 30. In the HIF monitoring system 30, an HIF scheme is shown with four function blocks: feature extraction and selection 38, SSL-based HIF detection 40, HIF location system 42, and HIF alarm and execution system 44.

A. Feature Extraction and Selection

The collected data from the PDC 36 is normalized first and then goes through the algorithm of feature extraction and selection 38.

1. Feature Extraction

When the data resolution is low, although it is possible to correlate dependence between time slots, the dependence gets too weak due to the large time elapse in between. μ-PMUs 34 provide higher sampling rate and measurement resolution compared to traditional PMUs. Under this circumstance, some features such as harmonics are captured with high fidelity during the transient period upon a fault. This characteristic of μ-PMUs 34 is important under the stringent detection requirements upon the HIF that has a very low fault current.

The following shows one example of how features are extracted sequentially for a physical power system. First, DFT is applied to estimate the voltage and current, and multiple physical quantities are calculated to quantify how large their magnitudes are. Second, the derivative of some variables is taken to quantify how fast the parameter changes. Such a process can capture small changes which may not trigger traditional HIF detection methods. Third, the harmonic magnitude coefficients (magnitudes) are estimated through Kalman filtering by decomposing different harmonics and learn the transition matrix (coefficient). The transition matrix here refers to the state transition matrix F. Assuming measurement z(k) of the incoming signal x(k), With the following Kalman filter model, the state variable X(k) can be recursively estimated: $X(k+1)=F_x(k)$, $z(k)=H_x(k)+v(k)$, where F is the transition matrix and v(k) is the measurement noise.

Such features are presented as the first-order harmonics of in-phase and in-quadrature voltage components, i.e., $KF_V \cos(H_{V1})$ and $KF_V \sin(H_{V1})$. Finally, power expert information is converted to capture some unconventional phenomena, e.g., $\theta_{V_2}-\theta_{V_0}$, the angle difference between the negative and zero sequence voltage. Empirically, such a feature is found to be a good indicator for the unbalance level in power distribution systems 32 caused by HIFs. It is noteworthy that, in the HIF monitoring system 30, the features are taken from several μ-PMUs 34 in different locations to provide the synchronized spatial data. The general window size of time-series measurement adopted is 200 ms (in a μ-PMU with 120 frame/sec output streaming, its length is equivalent to 24 samples). The window size is adjustable according to the event under study. With such a systematic design, a feature pool is generated in Table II.

TABLE II

| Type | Example Feature |
| --- | --- |
| Time series feature | $V_{abc}$, $I_{abc}$ |
| DFT-based original | P, Q, $V_{012}$, $I_{012}$, φ |
| DFT-based 1st order derivative | df/dt, dV/dt, dP/dt, $dH_{V1}/dt$ |
| KF-based original | $KF_V \cos(H_{V1} \sim H_{V6})$, $KF_V \sin(H_{V1} \sim H_{V6})$ |
| Other | $\theta_{V_2}-\theta_{V_0}$, dV/dP, df/dP, $KF_{V_{DC}}$ |

2. Feature Selection

The wrapper approach is adopted herein as the feature evaluator to solve the binary classification problem in HIF detection. Unlike the filter approach, the training set in the wrapper approach goes through three steps before it is sent to the ultimate induction algorithm: feature selection search, feature evaluation, and induction algorithm. The best-first search engine is employed in the feature selection search, due to its robustness comparing with the hill-climbing search engine. Best-first search is a method that does not just terminate when the performance starts to drop but keeps a list of all attribute subsets evaluated so far, sorted in order of the performance measure so that it can revisit an earlier configuration instead. It searches the space of attribute subsets by greedy hill-climbing augmented with a backtracking facility. Its algorithm is shown in Algorithm 1.

Algorithm 1 Best-First Algorithm

1: Put the initial state on the OPEN list.
2: CLOSED list ← φ, BEST ← initial state.
3: Let v = arg max$_{w \in OPEN}$f(w) (get the state from OPEN with maximal f(w)).
4: Remove v from OPEN, add v to CLOSED.
5: if f(v) − ε > f(BEST) then
6:    BEST ← v.
7: Expand v: apply all operators to v, giving v's children.
8: For each child not in the CLOSED or CLOSED list, evaluate and add to the CLOSED list.
9: if BEST changed in the last k expansions then
10:    goto 3.
    return BEST.

The evaluation function used here is five-fold CV. The assumption is that all folds are independent while training. The number of repetitions is determined on the fly by evaluating the standard deviation of the accuracy estimate. If 1% of the standard deviation of the accuracy estimate is violated and five CVs have not been executed, an extra CV is initiated. This heuristic method works well from applicability to efficiency when dealing with large datasets. Simply speaking, with the best-first search method, the exploration of feature space does not just terminate when the performance (estimated by CV) starts to drop but keeps a list of all feature subsets evaluated so far, sorted in order of the performance measure, so that it can revisit an earlier feature combination instead. If an improved node is not found in the last k expansions, the search is terminated. An improved node is defined as a node with an accuracy estimation at least E higher than the best one found so far. In embodiments herein, k is set to five and E is 0.1%.

B. Classification Between HIF and Non-HIF

By collecting various feature data from each μ-PMU 34, the HIF detection can be formulated as a large-scale binary classification problem, with the goal of accurately classifying each μ-PMU's 34 measurement data as either 'HIF' or 'non-HIF'. The SSL-based detection approach is used herein. The information-theoretic SSL method outputs the probability values for each observation based on local μ-PMU 34 measurement. In other words, each μ-PMU 34 corresponds to one classification model based on its local measurement. Specifically, the model in Equation 1 of Section II-B is trained with the best parameters chosen by CV. This model minimizes the loss function regarding the posterior probability and maximizes the mutual information between the unseen data $x_i$ and the label y. After the optimization process, the SSL method provides a probability matrix $Y_{prob}(i,j)$, which indicates the probability that data set $x_i$ belongs to class j—either HIF or non-HIF.

The generalization error bounds of the proposed SSL-based HIF detection 40 problem can be established through its accessible analytical solution. The inequality is provided below since it guarantees a tight upper bound of the proposed protective scheme based on the inductive Rademacher complexity. If the real class labels of the dataset $X_U$ are available for classification (even though they are not used for training), for any $\eta>0$ and $0<\epsilon<1$, with the probability at least $1-\epsilon$, the estimation expectation of the indicator loss function (defined as $\ell(z)=(1-\text{sign}(z))/2$) with respect to the correct labeled data is bounded by $$E\ell(yf(x)) \leq \frac{1}{n}\sum_{i=1}^{n}\ell_\eta(y_if(x_i)) + \frac{2B_kB_F}{\eta\sqrt{n}} + \min\left(3, 1+\frac{4B_k^2B_F'}{\eta}\right)\sqrt{\frac{\ln(2/\epsilon)}{2n}},$$

where the output label y is now reformulated as ±1, multiplied by the decision function $f(x)$ that provides a closed form solution to label y as well using the optimal solution—the vector $\alpha^*$ obtained from Equation 1 in Section II-B, $\ell_\eta(z)=\min(1, \max(1-z/\eta))$ is the surrogate loss function, $B_k$, $B_F$, and $B_F'$ are the model parameters associated with $\alpha^*$. The error bound equation shows how embodiments benefit from unlabeled data by a lower empirical error when n increases. This illustrates the advantage of introducing SSL in the HIF detection problem.

C. HIF Location Function

Once the HIF is detected, the HIF location information will be beneficial to the utility's dispatch center. The challenge of HIF location comes from the deviation of the fault impedance. Mathematically, the standard deviation of the fault impedance depends on the fault current range under study, along with the characteristics of the ground (soil) or grounded object (concrete, tree, etc.). As mentioned in Section I, an HIF current usually ranges from 10 to 50 A, which is the "blind zone" of conventional relays. To have a larger detection range, the upper bound is increased from 50 A to 100 A. In order to generate a fault current between 10 and 100 A in a 25 kV benchmark system, the fault range of 200~1,500 ohms ($\Omega$) is then calculated. More details of the model settings are provided in Section VII. Under the circumstances, two types of probability distribution models are proposed to capture the deviation of the fault impedance: normal distribution and uniform distribution.

1. Normal Distribution of the HIF Impedance

In the first scenario, the HIF impedance $R_F$ (including $R_g$ and $R_n$) follows $R_F \sim \mathcal{N}(\mu, \sigma^2)$. Thus, the fault location $\delta$ follows $$\delta \sim \mathcal{N}\left(\frac{\mu-c_0}{c_1}, \left(\frac{\sigma}{c_1}\right)^2\right),$$

where both $c_0$ and $c_1$ contain their positive and negative coefficients. Furthermore, the confidence interval of the fault location estimation can be easily quantified.

2. Uniform Distribution of the HIF Impedance

In the second scenario, the HIF impedance is uniformly distributed within an impedance range. Assuming that $R_F$ falls in the range of $(R_{min}, R_{max})$, where $0<R_{min}<R_{max}$. The range of the fault location estimation therefore belongs to $$\left(\frac{R_{min}-c_0}{c_1}, \frac{R_{max}-c_0}{c_1}\right).$$

D. High Impedance Fault Alarm and Execution System

Once the HIF location range is computed, the HIF alarm and execution system 44 sends an assertion signal regarding the detection of an HIF to the control center of the system operator. The resulting action, depending on the local grid code, can be an alarm, a tripping signal sent to the execution system which is part of the control system of a corresponding circuit breaker 46, or another action to address the HIF.

IV. Evaluation Results

A. Benchmark System

Figure 7:
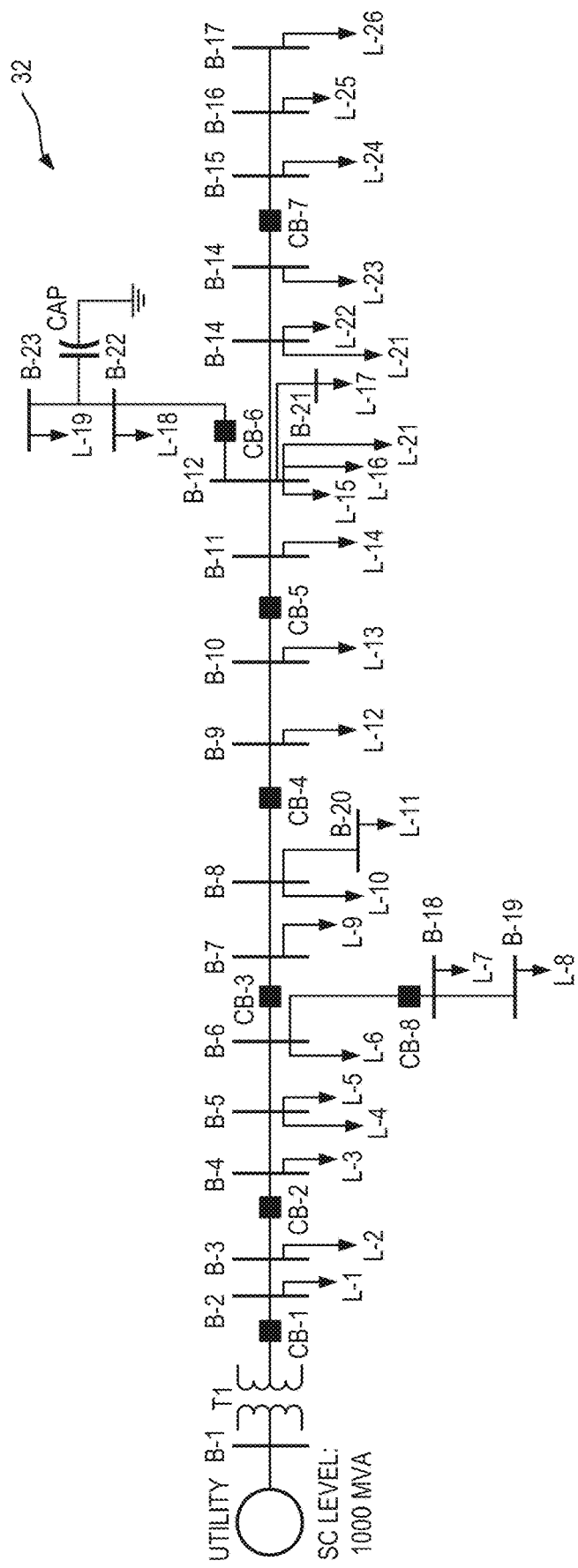
FIG. 7 is a single line schematic diagram of a benchmark power distribution system used for evaluating the HIF monitoring system of FIG. 6.

FIG. 7 is a single line schematic diagram of a benchmark power distribution system 32 used for evaluating the HIF monitoring system 30 of FIG. 6. The benchmark power distribution system 32 under study models a 25 kV distribution feeder, which has a 120 kV-25 kV transformer connecting the utility and the feeder. The benchmark system 32 runs in a real-time simulator which will be part of the hardware evaluation platform that is explained in the next section.

B. Feature Selection in HIF Detection

An example feature pool includes 246 features. Many other features in the literature can be added to the feature pool in Table II. Therefore, the feature pool is flexible and expandable to maximize the HIF detection accuracy. The best-first search algorithm is employed, and the search is terminated if an improved node in the last k expansions is not found. An improved node is defined as a node with an accuracy estimation at least E higher than the best one found so far.

Since the wrapper approach considers how the algorithm and the training set interact, evaluations have been done on real and artificial datasets to assess two different families of induction algorithms: decision trees (DT) and naive-Bayes (NB). Literature indicates that both induction algorithms have achieved significant performance improvement on the same datasets. Here, a comparison is provided between them in Table III. DT outperforms NB in terms of the merit of test subset, interpretability and hardware applicability.

TABLE III

| Algorithm | # of features (original, final) | Merit of best subset found | Interpretability |
|---|---|---|---|
| DT | 246, 10 | 1.000 | High |
| NB | 246, 14 | 0.999 | Low |

DT is chosen as the induction algorithm due to its visualizability, interpretability, and applicability. The final selected feature group is exhibited in Table IV. Ten features are selected in this case. To clearly demonstrate the effectiveness of the selection, the feature group (e.g., EFS) is categorized by the references.

TABLE IV

| Feature in the selected feature group |
|---|
| $V_0$, $I_2$, $I_0$ |
| $\theta_{V_2}-\theta_{V_0}$, |
| $\theta_{I_2}-\theta_{I_0}$ |
| $V_{THD}^{3rd}$, $V_{THD}^{5th}$, |
| $KF_V \sin(H_{V1})$, |
| $KF_V \cos(H_{V5})$, |
| $KF_V \cos(H_{V1})$ |

The selected feature group includes sequence components of voltage and current ($V_0$, $I_2$, $I_0$), angle difference between sequence components ($\theta_{V_2}-\theta_{V_0}$, $\theta_{I_2}-\theta_{I_0}$), and the harmonic components derived from DFT and KF harmonic decomposition. Especially for the harmonic components, it contains the total harmonic distortion (THD) of the third and fifth order voltage signals, along with the in-phase (cos) and in-quadrant (sin) part of the KF estimated first (H1) and fifth (H5) order voltage signals. Since the μ-PMUs 34 cannot provide the harmonic components, voltage and current samples are collected by the PDC 36 first, then the HIF monitoring system 30 calculates the harmonics using the DFT- and KF-based signal processing techniques for multiple locations, as shown in FIG. 6.

Table V demonstrates the HIF detection performance comparison with other feature groups, including Yu (D. C. Yu and S. H. Khan, "An adaptive high and low impedance fault detection method," IEEE Trans. Power Del., vol. 9, no. 4, pp. 1812-1821, October 1994). Evaluation data is obtained from 198 HIF events and 256 non-HIF events using MATLAB Simulink. Supervised learning is conducted to assess the binary classification performance. Meanwhile, the following evaluation index is employed:

$$\text{Precision} = \frac{TP}{TP + FP},$$

where TP is the number of the true positive instances, and FP is the number of false positive instances, specifically, it is the number of incorrectly detected fault events that are actually non-fault events. It indicates the percent of correctly predicted HIF instances over the total number of the predicted HIF instances.

$$\text{Recall} = \frac{TP}{TP + FN},$$

where FN is the number of false negative instances, specifically, it is the number of incorrectly detected non-fault events that are actually fault events. It measures the fraction between the correctly predicted HIF instances and the total number of HIF instances in the dataset.

$$F1\ \text{score} = \frac{2 * \text{precision} * \text{recall}}{\text{precision} + \text{recall}}.$$

This index is the harmonic mean of the precision and recall, providing an overall evaluation of the classifier.

TABLE V

| Method | # of features | Precision | Recall | F1 score |
|---|---|---|---|---|
| Yu | 2 | 0.519 | 0.203 | 0.292 |
| Filter approach (top 10 features) | 10 | 0.968 | 0.959 | 0.964 |
| Selected feature group | 10 | 0.979 | 1.000 | 0.989 |

Note:
The top 10 features in filter method include: $\theta_{I_5}$-$\theta_{I_Q}$, $I_2$, $I_0$, $V_2$, $V_0$, $KF_I\cos(H_{I3})$, $KF_V\sin(H_{V3})$, $KF_V\cos(H_{V3})$, $KF_V\cos(H_{V5})$, $KF_V\sin(H_{V5})$.

C. HIF Detection Performance

With the selected feature group, the proposed SSL algorithm is further tested in the benchmark systems. To test the performance of the proposed SSL algorithm, 14,580 HIF and non-HIF events are simulated and labeled. These events include a wide range of scenarios, such as HIFs with different fault impedance, HIFs with different fault location, HIFs with different fault types, load switching, capacitor switching, load variation, etc. In order to demonstrate the concept of SSL, two typical features—df/dt and dV/dt—are chosen to visualize the complexity of the classification task in a two-dimensional plot and to depict the SSL classification process of the unlabeled data.

Figure 8A:
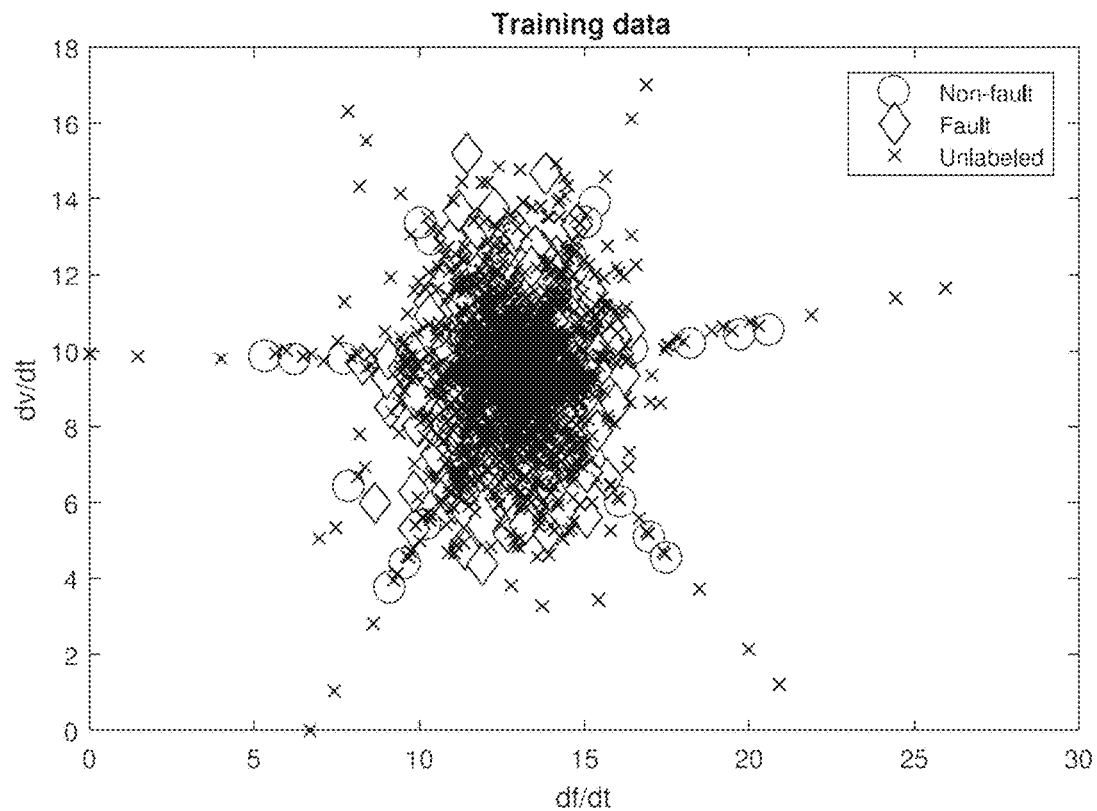
FIG. 8A is a graphical representation of training data used in an exemplary embodiment of a semi-supervised learning (SSL) approach used for HIF detection in the HIF monitoring system of FIG. 6.

FIG. 8A is a graphical representation of training data used in an exemplary embodiment of an SSL approach used for HIF detection in the HIF monitoring system 30 of FIG. 6. Here, the two selected features can be any other features to focus on how SSL works. Initially, 25% of the data is served as the training data, illustrated in FIG. 8A. Concretely, the data are labeled with either circles, representing the non-fault events, or diamonds, representing the fault events. The 75% unlabeled data is marked with "x". There is a prevailing overlap between the non-fault and fault data, which indicates the necessity of deploying a viable large-scale binary classification algorithm.

Figure 8B:
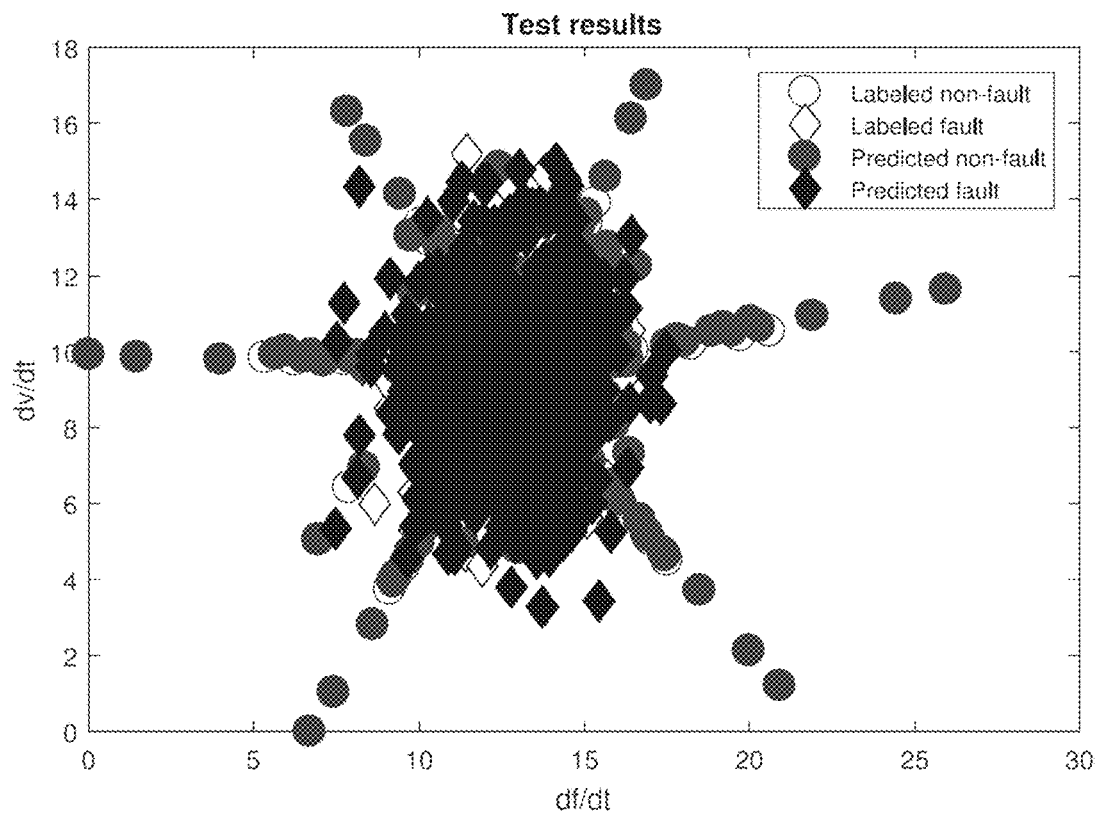
FIG. 8B is a graphical representation of testing data used in the SSL approach of FIG. 8A.

FIG. 8B is a graphical representation of testing data used in the SSL approach of FIG. 8A. For the results of the SSL algorithm, two extra categories are added to highlight the predicted classes, marked with filled circles and diamonds. The proposed method learns from the training data and conducts prediction on the unlabeled dataset. Moreover, although multi-dimension data is hard to visualize, FIG. 8B intuitively indicates, to some extent, that the predicted points are spatially consistent with the labeled data in FIG. 8A.

To further investigate the accuracy of the SSL-based method, the performance of this method is demonstrated in terms of regularization coefficients, precision, recall, and F1 score in Table VI. This table further compares the classification performance under two device precision: 2 digits representing the measurement from a commercial digital relay, and 4 digits representing a state-of-the-art μ-PMU's voltage and current measurement. In this case study, the model parameters associated with α* have the following values: $B_k$=10.0000, $B_F'$=11.0031, and $B_F$=147.7377.

TABLE VI

| % of labeled data | Device precision (2 digits) | | | | | Device precision (4 digits) | | | | |
|---|---|---|---|---|---|---|---|---|---|---|
| | γ | λ | precision | recall | F1 score | γ | λ | precision | recall | F1 score |
| 6.25 | 0.01 | 1e−5 | 0.8396 | 0.9604 | 0.8959 | 0.01 | 1e−5 | 0.8678 | 0.9685 | 0.9154 |
| 12.5 | 0.1 | 1e−5 | 0.8479 | 0.9865 | 0.9120 | 0.01 | 1e−5 | 0.8553 | 0.9800 | 0.9134 |
| 25 | 0.01 | 1e−5 | 0.8031 | 0.9552 | 0.8726 | 0.01 | 1e−5 | 0.9000 | 0.9554 | 0.9269 |
| 50 | 0.01 | 1e−5 | 0.9981 | 0.9981 | 0.9981 | 0.01 | 1e−5 | 0.9981 | 0.9962 | 0.9972 |

On one hand, by comparing between 2 digits and 4 digits results, Table VI reveals and quantifies the improvement on fault detection. Take the metric of precision as an example, the enhancement on measurement precision has improved the precision by 2.82%, 0.74%, 9.69%, and 0.00% when there are 6.25%, 12.5%, 25%, and 50% of labeled data. On the other hand, statistically, the F1 score on average rises as the percentage of labeled data increases. However, to maintain a fair comparison, the labeled data is randomly selected, which means that the quality of data during SSL varies case to case. However, in spite of performance oscillation due to the quality of data, the precision, recall and F1 score have a trend to increase as the percentage of labeled data grows as shown in Table VI.

The decreasing of F1 score in the 2 digits results from 12.5% to 25% of labeled data indicates that it happens when more percentage of data is labeled but they can hardly provide more mutual information for the SSL. Nevertheless, the overall performance increases as there are more labeled data. Similarly, for the case where the F1 score in the 2 digits result is higher than that in the 4 digits results, since the percentage of labeled data is already high (50%), the device precision no longer plays a dominant role. Instead, the quality of data becomes more important, resulting in the F1 score difference of 0.0009. It can be concluded that the performance of the proposed method maintains a larger than 85% precision rate when the percent of labeled data is no lower than 6.25% using the µ-PMUs 34, the recall rate of which is even higher. Besides, it highlights the advantage of the adoption of high precision µ-PMU 34 over conventional relays in such a protection task.

D. HIF Location

As discussed previously, one of the advantages of the information-theoretic SSL method is the probabilistic output of the data classification results. This advantage enables embodiments to narrow down the faulty zones by collecting the probabilistic output from each µ-PMU 34. Eighteen events are simulated to test the probabilistic output of all µ-PMUs 34 that are monitoring, from upstream, the HIF events for six critical lines: Lines 2-3, 4-5, 7-8, 9-10, 11-12, 15-16. For each line, there are three fault locations tested. Clearly, under this assumption, the HIF location is observable only at these six lines. Table VII demonstrates one example on the case when the HIF is applied on Line 7-8 at 3.0 km downstream B-7 (total length of Line 7-8: 15 km). The probability output of each µ-PMU 34 is ranked using the averaged probability output values and determine the faulty line. As indicated by B-7 µ-PMU 34, the algorithm is 99.39% sure that the HIF is located at Line 7-8.

TABLE VII

| Location of µ-PMU | B-2 | B-4 | B-7 | B-9 | B-11 | B-15 |
|---|---|---|---|---|---|---|
| Avg. prob. output over a 200 ms window size | 0.2178 | 0.4041 | 0.9939 | 0.3808 | 0.1716 | 0.1775 |

Prior to presenting the location performance, the location error is defined as:

$$\text{Location error} = \frac{\text{estimated distance} - \text{actual distance}}{\text{line length}} \times 100\%.$$

The HIF monitoring system 30 is tested in multiple locations along the power distribution system 32.

Figure 9:
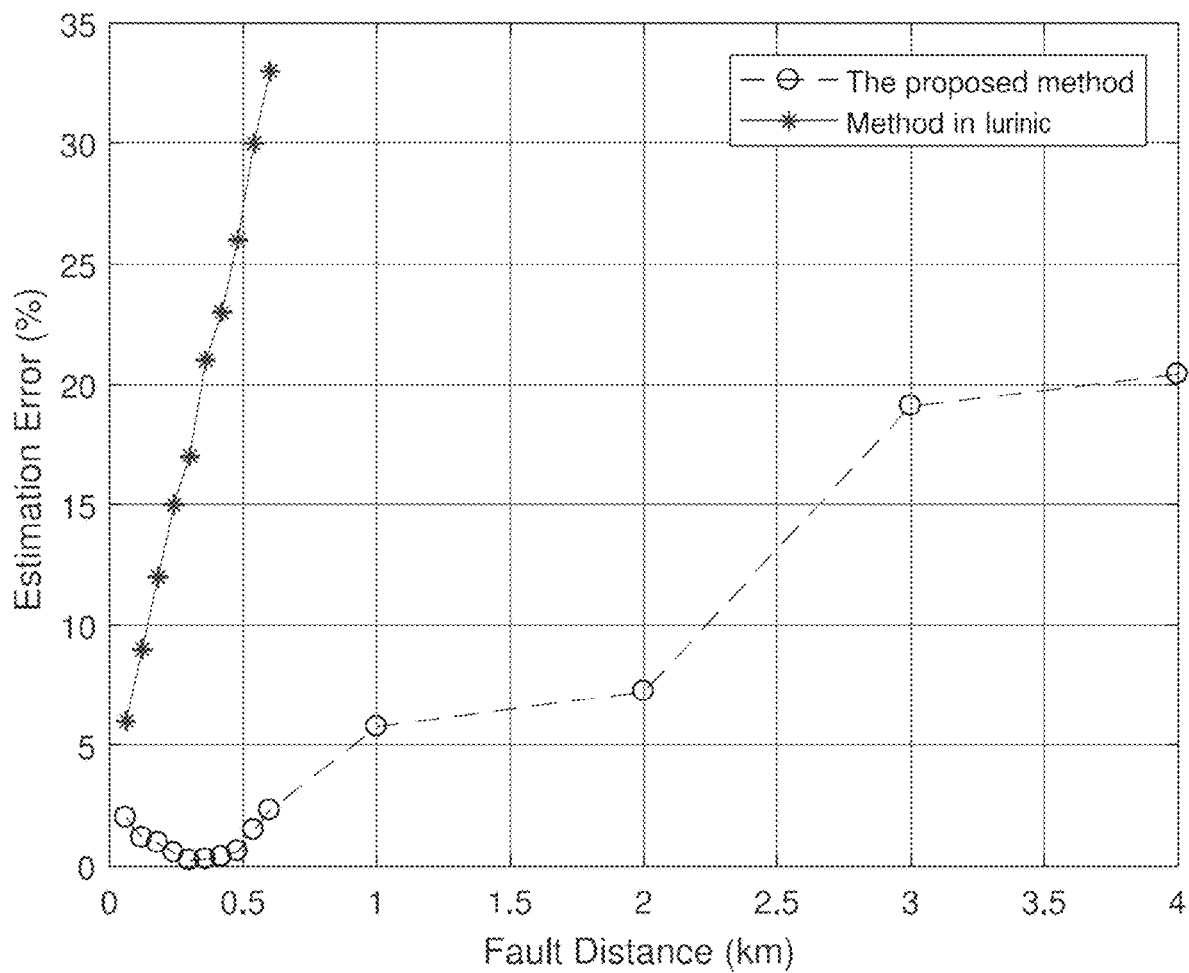
FIG. 9 is a graphical representation of fault location estimation error of the HIF locator of an embodiment of the HIF monitoring system of FIG. 6 compared with a traditional approach.

FIG. 9 is a graphical representation of fault location estimation error of the HIF locator (e.g., HIF location system 42) of an embodiment of the HIF monitoring system 30 of FIG. 6 compared with a traditional approach. The illustrated testing results are on the line between bus 2 and 3 (Line 2-3) of FIG. 7 and compared with estimation error of a traditional linear least square estimation (LSE) global behavior. The line length in the traditional approach is 0.6 km, whereas the line tested in the benchmark system is 4.167 km. Therefore, there are more data points in the results of the proposed method. The errors in the proposed method tend to decrease when fault distance increases from 0 to 0.4 km. This is because the variation of the fault impedance plays a prominent role when the fault is close to the measurement, and when the fault is further, the location estimation error is affected less by the fault impedance variation.

Compared with common low-impedance faults whose location can be quite accurate, the proposed fault location estimation method actually shows a significant improvement of performance. For example, for short lines less than 1 km, its location error is less than 6% compared with lurinic (L. U. lurinic, A. R. Herrera-Orozco, R. G. Ferraz, and A. S. Bretas, "Distribution systems high-impedance fault location: A parameter estimation approach," IEEE Trans. Power Del., vol. 31, no. 4, pp. 1806-1814, August 2016); while for lines up to 4 km, the method in lurinic cannot locate the HIF due to its limitations on measurement devices and the method. The HIF monitoring system 30 of FIG. 6 aims to bridge the gap on the longer distribution line HIF location. Current practice is that once the HIF is detected, the utility begins a public address advising of the danger, and also dispatches service personnel to search for the downed conductor. With the proposed method, 80% of a line's length does not require the searching of a line crew, and the removal of safety hazards is, therefore, more efficient.

Figure 10A:
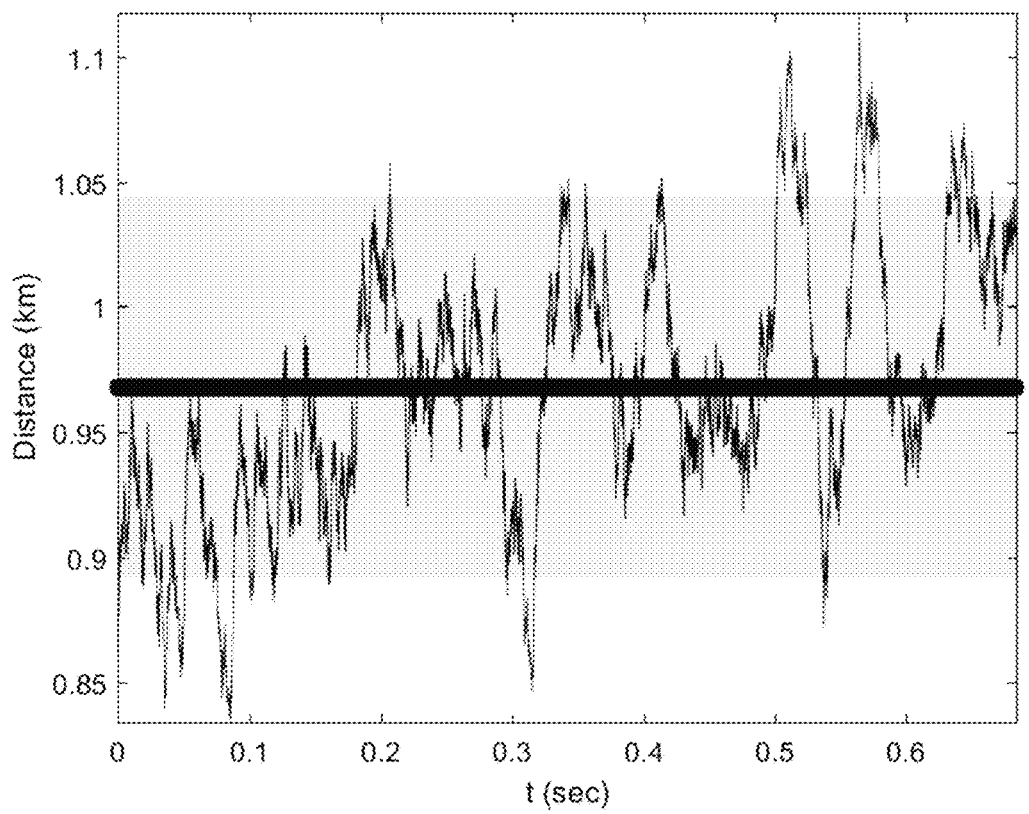
FIG. 10A is a graphical representation of fault location estimation when a fault occurs in an embodiment of the HIF monitoring system of FIG. 6 under a normal probability distribution.
Figure 10B:
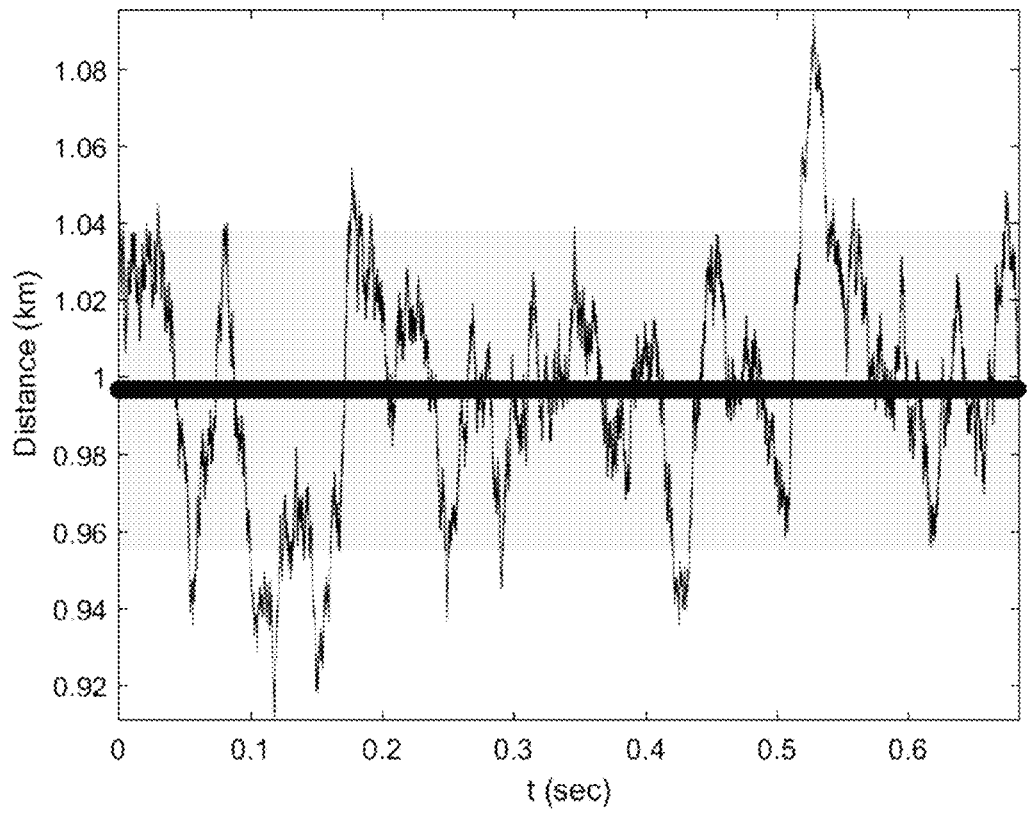
FIG. 10B is a graphical representation of fault location estimation when a fault occurs in an embodiment of the HIF monitoring system of FIG. 6 under a uniform probability distribution.

FIG. 10A is a graphical representation of fault location estimation when a fault occurs in an embodiment of the HIF monitoring system 30 of FIG. 6 under a normal probability distribution. FIG. 10B is a graphical representation of fault location estimation when a fault occurs in an embodiment of the HIF monitoring system 30 of FIG. 6 under a uniform probability distribution. FIGS. 10A and 10B show the fault location estimation when a fault that is 1.0 km downstream of bus 11 occurs. The distance estimation using moving window total least square method exhibits two behaviors under two types of the probability distribution of the fault impedance. When the gray band covers 85% of the estimation samples, FIG. 10A has a wider confidence interval band than FIG. 10B due to its large standard deviation of the fault impedance.

In addition, in comparison with the traditional approaches of lurinic and Milioudis (A. N. Milioudis, G. T. Andreou, and D. P. Labridis, "Detection and location of high impedance faults in multiconductor overhead distribution lines using power line communication devices," IEEE Trans. Smart Grid, vol. 6, no. 2, pp. 894-902, March 2015), Table VIII is shown to highlight the advantage of the proposed HIF location method. As indicated in Table VIII, the proposed solution is capable of handling the anti-parallel DC-source model with random fault impedance. Meanwhile, the utilization of µ-PMU 34 devices enables higher measurement accuracy.

TABLE VIII

| Method | HIF model | Randomness of fault impedance | Measuring device | Measuring accuracy |
|---|---|---|---|---|
| Iurinic | Anti-parallel anti-DC source | No | Disturbance monitoring equipment | 0.01 |
| Milioudis | Constant resistance | No | Power line communication | 0.01 |
| The proposed method | Anti-parallel anti-DC source | Yes | μ-PMU | 0.0001 |

V. Discussions

This section first discusses the effect of μ-PMU 34 placement, and then carries out more general evaluations considering fault scenarios in the context of measurement noise and distributed generations (DGs).

A. The Effect of μ-PMU Placement

It is reported that HIF instances are significantly less than those that trigger the operation of the conventional protection. Therefore, the location function of HIF is an add-on function to achieve. Similar to many other fault location methods that utilize PMUs or other devices, the admittance matrix is the key to them. For HIF location, it is assumed for illustrative purposes that μ-PMUs 34 are placed at each bus to get the full observability of the system. In some embodiments, μ-PMUs 34 are placed upstream of critical lines, such that those lines become observable for HIF location. If any load or DG is upstream of HIFs, the proposed fault detection method can work but the location method cannot due to the unobservability issue. Accordingly, some embodiments determine where and how many μ-PMUs 34 need to be placed to maintain the HIF location feature.

B. Performance Under Other Scenarios

1. Considering DGs and More Fault Scenarios

To investigate the effects of environmental noises on the feature selection and the accuracy of the proposed method, the performance of the feature selection and fault location is tested under white Gaussian noise with mean 0 and variance of $10^{-6}$ and $10^{-4}$. The HIF detection performance is tested on six lines (named after from bus-to bus) as can be found in FIG. 7. The HIF scenarios include 30%, 60%, and 90% of the length of each line listed. It is concluded that the selected features are not affected by environmental noise. Concretely, the superimposed noise does not change the results in Table IV. However, the accuracy of the fault location is affected by the noise. As shown in Table IX, the noise with a variance value of $10^{-4}$ deteriorates the fault location performance, and it gets worse when the HIF occurs at a further location. When the noise variance drops to $10^{-6}$, no notable alteration in the location results is observed. Meanwhile, two DGs are integrated: one is a synchronous generator on B-8, and the other is an inverter-interfaced wind turbine on B-17. The results listed in Table IX contain the effect of DGs. For critical lines that are observable to the μ-PMUs 34, since the HIF cannot cause obvious voltage change, the fault location performance is hardly compromised before and after the DGs are integrated.

TABLE IX

| Line | Noise var. | Errors (%) when HIF is located at | | |
|---|---|---|---|---|
| | | 30% | 60% | 90% |
| 2-3 (4.167 km) | 0 | 7.2 | 15.8 | 19.9 |
| | $10^{-4}$ | 8.5 | 16.8 | 20.6 |
| 4-5 (2.04 km) | 0 | 6.1 | 12.4 | 15.6 |
| | $10^{-4}$ | 9.8 | 17.7 | 21.7 |
| 7-8 (15.0 km) | 0 | 5.2 | 10.8 | 17.7 |
| | $10^{-4}$ | 1.8 | 6.9 | 25.8 |
| 9-10 (1.59 km) | 0 | 4.1 | 10.6 | 12.2 |
| | $10^{-4}$ | 9.0 | 12.0 | 18.4 |
| 11-12 (1.05 km) | 0 | 2.5 | 6.2 | 7.3 |
| | $10^{-4}$ | 11.8 | 16.0 | 19.0 |
| 15-16 (0.098 km) | 0 | 3.9 | 5.9 | 8.4 |
| | $10^{-4}$ | 11.2 | 14.0 | 16.6 |

2. Measurement Accuracy

Commercial μ-PMUs 34 have presented a satisfying accuracy in reality. It is reported that off-the-shelf μ-PMU 34 devices achieve an accuracy of 0.001° resolution for phasor angle, 0.0002% for phasor magnitude, and 0.01% for total vector of error (TVE). Since an HIF does not cause grid frequency deviation or even over-current, the measurement accuracy of μ-PMUs 34 is not compromised most of the time. However, it is noteworthy that decaying DC components may be present in fault currents, therefore, not every μ-PMU 34 has high accuracy in such a condition. Other sources of inaccurate μ-PMU data could be dropouts, packet loss, measurement bias, loss of GPS synchronization, etc., by which the robustness of the proposed method can be severely jeopardized. Regular testing and bad data detection mechanism are required to avoid the data quality issue.

VI. Hardware Evaluation Platform

Figure 11:
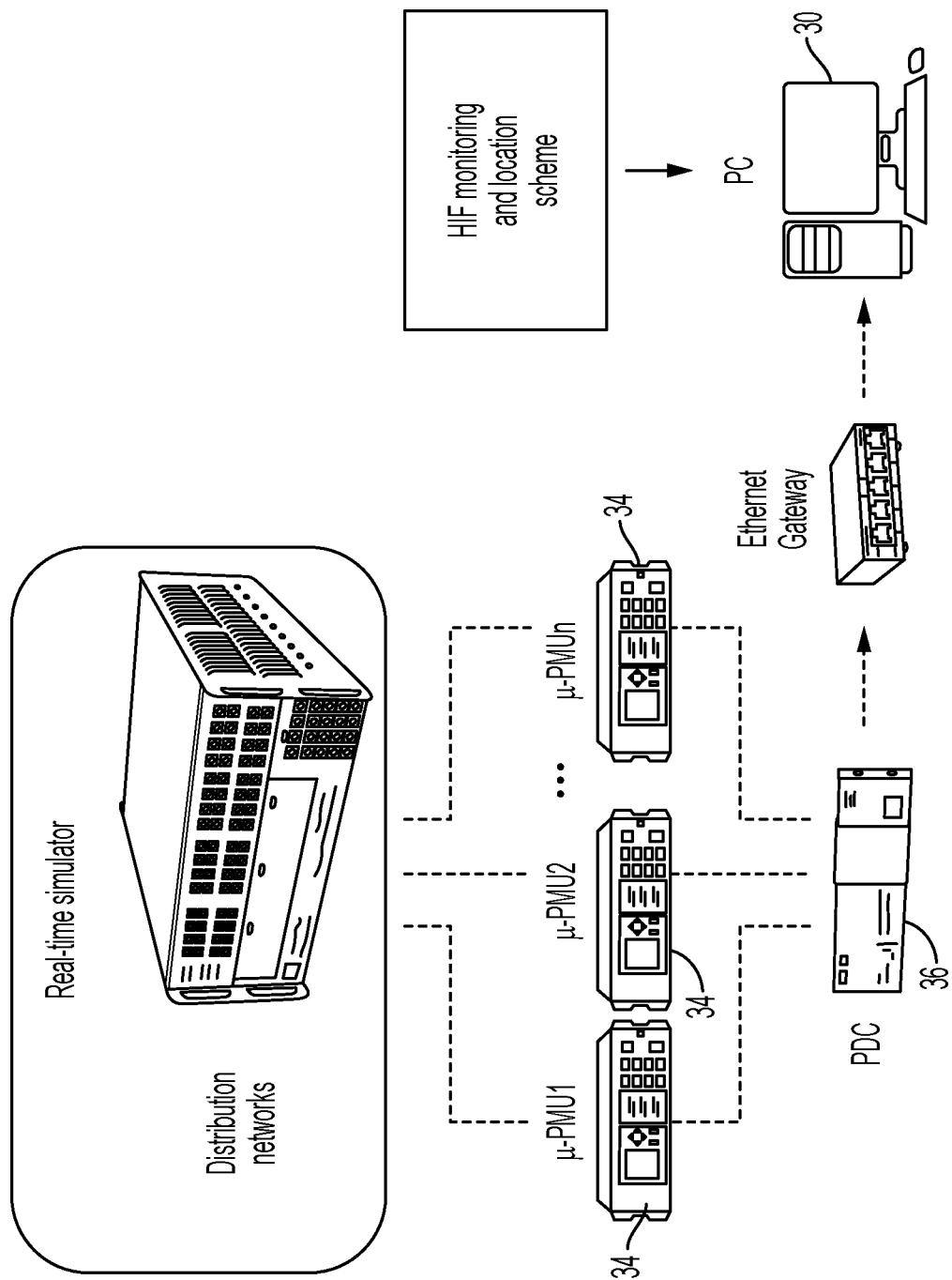
FIG. 11 is an exemplary platform used for simulating an embodiment of the HIF monitoring system of FIG. 6.

FIG. 11 is an exemplary platform used for simulating an embodiment of the HIF monitoring system 30 of FIG. 6. This platform is used to validate the proposed HIF monitoring system 30. The real-time simulator emulates the 25 kV distribution feeder of the power distribution system 32 of FIG. 7. Several μ-PMUs 34 are connected to the analog output of the simulator through amplifiers. Each μ-PMU 34 takes three-phase voltage and current signal of a certain bus and outputs the sample data to the PDC 36. The detection algorithm is embedded in the PC, which is programmed with all the functions of the proposed HIF monitoring and location algorithm. The results on the detection time are shown in Table X.

TABLE X

| Location of line | 2-3 | 4-5 | 7-8 | 9-10 | 11-12 | 15-16 |
|---|---|---|---|---|---|---|
| Avg. detection time (ms) | 469 | 482 | 488 | 514 | 491 | 470 |

The HIF detection performance is tested on six lines (named after from bus-to bus) in FIG. 7. The detection time is averaged over the measurement results by introducing HIFs at 30%, 60%, and 90% of the length of the line under study. The evaluation platform utilizes two μ-PMUs 34 to collect data. As discussed in Section IV-D, current practice is to send dispatches service personnel to search for the downed conductor. Therefore, the response and processing time is not a concern for the HIF detection application. The proposed scheme actually works as backup protection to catch the HIFs that overcurrent relays cannot detect. The requirement on the response time is not strict. In fact, some applications have achieved an overall latency below 200 ms. It is noteworthy that the detection output of the proposed scheme is not sent back to the real-time simulator. Further embodiments introduce the scheme output signal to the input of the simulator at the bus where circuit breaker 46 tripping is anticipated.

VII. Parameters of the HIF Model

To generate a fault current between 10 and 100 A in a 25 kV benchmark system, the model settings are provided in Table XI.

TABLE XI

| Component | Value Range | Values change every |
|---|---|---|
| $V_p$ | 5~6 kV | 0.1 ms |
| $V_n$ | 7~8 kV | 0.1 ms |
| $R_p$ | 200~1500 Ω | 0.1 ms |
| $R_n$ | 200~1500 Ω | 0.1 ms |

VIII. Using LSE for Calculating HIF Location

This section provides a simplified example that views fault impedance as a constant value to show how fault location is computed. The discussion considering the probability distribution of the fault impedance can be found in Section III-C. Equation 4 in Section II-C can be reformulated into $$v_n = \left[ Ri_n + L\frac{di_n}{dt} \ i_F \ sg_+(i_F) \ sg_-(i_F) \right] \cdot \begin{bmatrix} \delta \\ R_F \\ V_p \\ V_n \end{bmatrix} \text{ where} \quad \text{Equation 6}$$

$$sg_+(i_F) = \begin{cases} 1, & i_F > 0 \\ 0, & i_F \leq 0 \end{cases} \quad \text{Equation 7}$$

$$sg_-(i_F) = \begin{cases} 0, & i_F \geq 0 \\ -1, & i_F < 0 \end{cases} \quad \text{Equation 8}$$

In a typical LSE method, the solution to the parameter estimation of θ in y=Xθ+ξ is given by $$\hat{\theta} = (X^T X)^{-1} X^T y \quad \text{Equation 9}$$

where ξ represents the environment noise. Similarly, the fault location can be computed this way. Assume N samples of μ-PMU 34 output streaming data are used (including the derived data $$\frac{di_n}{dt} \Big),$$

each element in Equation 6 can be expanded into $$\begin{bmatrix} v_{n,1} \\ v_{n,2} \\ \vdots \\ v_{n,N} \end{bmatrix} = \begin{bmatrix} \left(Ri_n + L\frac{di_n}{dt}\right)_1 & i_{F,1} & sg_+(i_{F,1}) & sg_-(i_{F,1}) \\ \left(Ri_n + L\frac{di_n}{dt}\right)_2 & i_{F,2} & sg_+(i_{F,2}) & sg_-(i_{F,2}) \\ \vdots & \vdots & \vdots & \vdots \\ \left(Ri_n + L\frac{di_n}{dt}\right)_N & i_{F,N} & sg_+(i_{F,N}) & sg_-(i_{F,N}) \end{bmatrix} \cdot \begin{bmatrix} \delta \\ R_F \\ V_p \\ V_n \end{bmatrix} \quad \text{Equation 10}$$

The transposed vector in Equation 6, which contains the fault location variable δ, can, therefore, be computed using Equation 9.

Those skilled in the art will recognize improvements and modifications to the preferred embodiments of the present disclosure. All such improvements and modifications are considered within the scope of the concepts disclosed herein and the claims that follow.

What is claimed is:

1. A high impedance fault (HIF) monitoring system, comprising:
   a feature extractor, configured to:
      receive power measurements from a plurality of sensors in a power distribution system; and
      extract an effective feature set (EFS) for detecting an HIF from the power measurements by implementing a wrapper method, wherein the wrapper method comprises:
         searching for features of the power measurements;
         evaluating the features based on an accuracy of the features to determine which of the features are to be in the EFS; and
         performing an induction algorithm to determine the accuracy of the features; and
   an HIF detector configured to determine occurrence of the HIF using machine learning and the EFS, wherein the machine learning of the HIF detector is trained using semi-supervised learning (SSL), the SSL comprising:
      minimizing a loss function regarding a posterior probability and maximizing mutual information between unseen data and a label to generate a probability matrix that indicates a probability that a data set belongs to either the HIF or a non-HIF;
      providing an estimation expectation of an indicator loss function with respect to correct labeled data in the data set where the label is reformulated based on a decision function that provide a closed form solution to the label to determine the occurrence of the HIF.

2. The HIF monitoring system of claim 1, further comprising an HIF locator configured to determine a probable location of the HIF based on an output of the HIF detector.

3. The HIF monitoring system of claim 2, wherein the HIF locator is configured to determine the probable location of the HIF by estimating a distance value of the HIF using fault current estimation.

4. The HIF monitoring system of claim 3, wherein the HIF locator is further configured to determine the probable location of the HIF by using a moving window least square approach to identify a zone in the power distribution system where the HIF is more likely to be occurring than other zones.

5. The HIF detector of claim 1, wherein:
   each of the plurality of sensors is a micro phasor measurement unit (μ-PMU); and
   the power measurements comprise phasor measurements from the plurality of μ-PMUs.

6. The HIF monitoring system of claim 5, wherein:
   the feature extractor is configured to extract a first portion of the EFS by applying a discrete Fourier transform (DFT) to the phasor measurements from the plurality of μ-PMUs; and
   the first portion of the EFS comprises at least one of a zero sequence voltage ($V_0$), a positive sequence voltage ($V_1$), a negative sequence voltage ($V_2$), a zero sequence current ($I_0$), a positive sequence current ($I_1$), or a negative sequence current ($I_2$).

7. The HIF monitoring system of claim 6, wherein the feature extractor is further configured to extract an angle difference between the negative sequence voltage and the zero sequence voltage ($\theta_{V_2}-\theta_{V_0}$).

8. The HIF monitoring system of claim 6, wherein:
the feature extractor is further configured to extract a second portion of the EFS by applying a Kalman filter (KF) to the phasor measurements from the plurality of μ-PMUs; and
the second portion of the EFS comprises at least one of an estimated in-phase component of a harmonic of voltage ($KF_V \cos(H_{V1} \sim H_{V6})$) or an estimated in-quadrature component of a first harmonic of voltage ($KF_V \sin(H_{V1} \sim H_{V6})$).

9. The HIF monitoring system of claim 1, further comprising an HIF alarm configured to provide an indication of the HIF occurrence.

10. The HIF monitoring system of claim 9, further comprising an HIF locator configured to determine a probable location of the HIF based on an output of the HIF detector;
wherein the HIF alarm is further configured to provide an indication of the probable location of the HIF.

11. The HIF monitoring system of claim 10, wherein the HIF alarm is further configured to provide a tripping signal to the power distribution system to cause a circuit breaker corresponding to the probable location of the HIF to trip.

12. A method for detecting and locating a high impedance fault (HIF), the method comprising:
receiving power measurements from a power distribution system;
extracting a power feature indicative of HIF occurrence from the power measurements by implementing a wrapper method, wherein the wrapper method comprises:
searching for features of the power measurements;
evaluating the features based on an accuracy of the features in performing to determine which of the features is to be the power feature; and
performing an induction algorithm to determine the accuracy of the features;
determining occurrence of an HIF based on the power feature, wherein machine learning is trained using semi-supervised learning (SSL), the SSL comprising:
minimizing a loss function regarding a posterior probability and maximizing mutual information between unseen data and a label to generate a probability matrix that indicates a probability that a data set belongs to either the HIF or a non-HIF;
providing an estimation expectation of an indicator loss function with respect to correct labeled data in the data set where the label is reformulated based on a decision function that provides closed form solution to the label to determine the occurrence of the HIF; and
determining a probable location of the HIF based on the power measurements.

13. The method of claim 12, wherein the power feature corresponding to the HIF occurrence is an angle difference between a negative sequence voltage and a zero sequence voltage ($\theta_{V_2}-\theta_{V_0}$).

14. The method of claim 13, wherein extracting the angle difference $\theta_{V_2}-\theta_{V_0}$ comprises performing a discrete Fourier transform (DFT) of the power measurements.

15. The method of claim 12, further comprising:
extracting an effective feature set (EFS) comprising an angle difference between a negative sequence voltage and a zero sequence voltage ($\theta_{V_2}-\theta_{V_0}$) and at least one of a zero sequence voltage ($V_0$), a positive sequence voltage ($V_1$), a negative sequence voltage ($V_2$), a zero sequence current ($I_0$), a positive sequence current) ($I_1$), a negative sequence current ($I_2$), or a harmonic of a received voltage signal ($KF_V \cos(H_{V1} \sim H_{V6})$ or $KF_V \sin(H_{V1} \sim H_{V6})$); and
determining the occurrence of the HIF based on the EFS.

16. The method of claim 15, wherein extracting the EFS comprises sequentially extracting features of the EFS by:
performing a set of discrete Fourier transforms (DFTs) on the power measurements;
taking derivatives of one or more features extracted with the set of DFTs; and
Kalman filtering the power measurements.

17. A phasor data concentrator (PDC) for a power distribution system, the PDC comprising:
a network interface;
a memory configured to store power measurements received over the network interface from a plurality of sensors in the power distribution system; and
a high impedance fault (HIF) monitor connected to the memory and comprising:
feature extraction logic, configured to extract an effective feature set (EFS) for detecting an HIF from the power measurements by implementing a wrapper method, wherein the wrapper method comprises:
searching for features of the power measurements;
evaluating the features based on an accuracy of the features in performing to determine which of the features are to be in the EFS; and
performing an induction algorithm to determine the accuracy of the features;
HIF detection logic configured to determine occurrence of the HIF using the EFS wherein the HIF detection logic comprises machine learning that is trained using semi-supervised learning (SSL), the SSL comprising:
minimizing a loss function regarding a posterior probability and maximizing mutual information between unseen data and a label to generate a probability matrix that indicates a probability that a data set belongs to either the HIF or a non-HIF;
providing an estimation expectation of an indicator loss function with respect to correct labeled data in the data set where the label is reformulated based on a decision function that provides closed form solution to the label to determine the occurrence of the HIF; and
HIF location logic configured to determine a probable location of the HIF based on an output of the HIF detection logic.

18. The PDC of claim 17, wherein:
the network interface is further configured to couple to a control system in the power distribution system; and
the HIF monitor asserts an HIF signal in response to detection of the HIF.

19. The PDC of claim 18, wherein the HIF signal comprises an indication of the probable location of the HIF.

* * * * *